United States Patent
Endoh et al.

(10) Patent No.: US 7,633,045 B2
(45) Date of Patent: Dec. 15, 2009

(54) OPTICAL DEVICE, METHOD FOR PRODUCING MASTER FOR USE IN PRODUCING OPTICAL DEVICE, AND PHOTOELECTRIC CONVERSION APPARATUS

(75) Inventors: Sohmei Endoh, Tokyo (JP); Kazuya Hayashibe, Tokyo (JP); Tooru Nagai, Tokyo (JP); Ikuhiro Hideta, Tokyo (JP); Shirasagi Toshihiko, Tokyo (JP); Kimitaka Nishimura, Tokyo (JP); Tadao Suzuki, Tokyo (JP)

(73) Assignees: Sony Corporation, Tokyo (JP); Sony Disc & Digital Solutions Inc., Tokyo (JP)

( * ) Notice: Subject to any disclaimer, the term of this patent is extended or adjusted under 35 U.S.C. 154(b) by 104 days.

(21) Appl. No.: 12/090,817

(22) PCT Filed: Aug. 21, 2007

(86) PCT No.: PCT/JP2007/066512
§ 371 (c)(1),
(2), (4) Date: Apr. 18, 2008

(87) PCT Pub. No.: WO2008/023816
PCT Pub. Date: Feb. 28, 2008

(65) Prior Publication Data
US 2008/0265149 A1    Oct. 30, 2008

(30) Foreign Application Priority Data
Aug. 21, 2006   (JP) .............................. 2006-224173
Dec. 15, 2006   (JP) .............................. 2006-338787

(51) Int. Cl.
*G01D 5/26*   (2006.01)

(52) U.S. Cl. .............. 250/216; 250/237 R; 250/231.13; 359/896; 216/24; 216/41

(58) Field of Classification Search .................. 250/216, 250/237 R, 237 G, 231.13, 231.14; 359/558, 359/601, 894, 896; 216/24, 41
See application file for complete search history.

(56) References Cited

U.S. PATENT DOCUMENTS

| | | |
|---|---|---|
| 7,005,246 B2 | 2/2006 | Nagasaka et al. |
| 7,297,386 B2 | 11/2007 | Suzuki et al. |
| 2002/0135847 A1 | 9/2002 | Nagasaka et al. |
| 2003/0011315 A1 | 1/2003 | Ito et al. |
| 2005/0074576 A1 | 4/2005 | Chaiken et al. |
| 2006/0093964 A1 | 5/2006 | Nagasaka et al. |
| 2008/0304155 A1* | 12/2008 | Endoh et al. ................. 359/558 |

FOREIGN PATENT DOCUMENTS

JP    2003-004916    1/2003

(Continued)

*Primary Examiner*—Kevin Pyo
(74) *Attorney, Agent, or Firm*—K&L Gates LLP

(57) ABSTRACT

In an optical device, a number of structures having higher portions or lower portions are arranged at a fine pitch equal to or shorter than a wavelength of visible light on a surface of a base. Each of the structures is arranged to form a plurality of arc track rows on the surface of the base, and to form a quasi-hexagonal lattice pattern, and the structure has an elliptical cone or truncated elliptical cone shape having a major axis in a circumferential direction of the arc tracks.

21 Claims, 27 Drawing Sheets

FOREIGN PATENT DOCUMENTS

| | | |
|---|---|---|
| JP | 2003-131390 | 5/2003 |
| JP | 2003-240904 | 8/2003 |
| JP | 2003-294910 | 10/2003 |
| JP | 2003-322705 | 11/2003 |
| JP | 2004-317922 | 11/2004 |
| JP | 2005-031538 | 2/2005 |
| JP | 2006-038928 | 2/2006 |

* cited by examiner (VIEWED IN X DIRECTION)

(VIEWED IN Y DIRECTION)

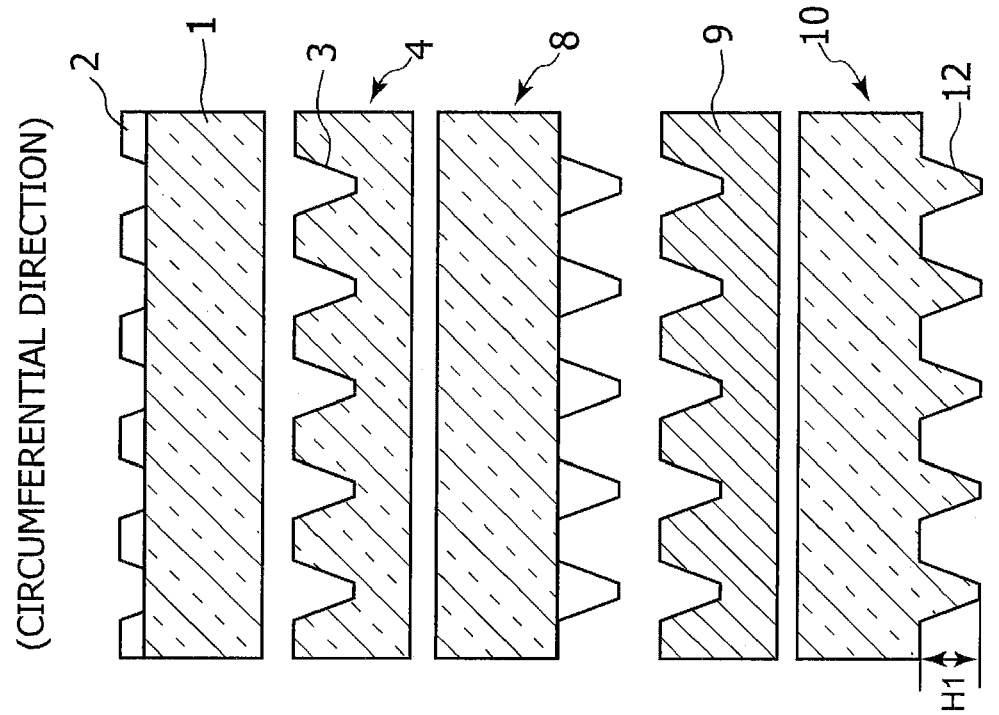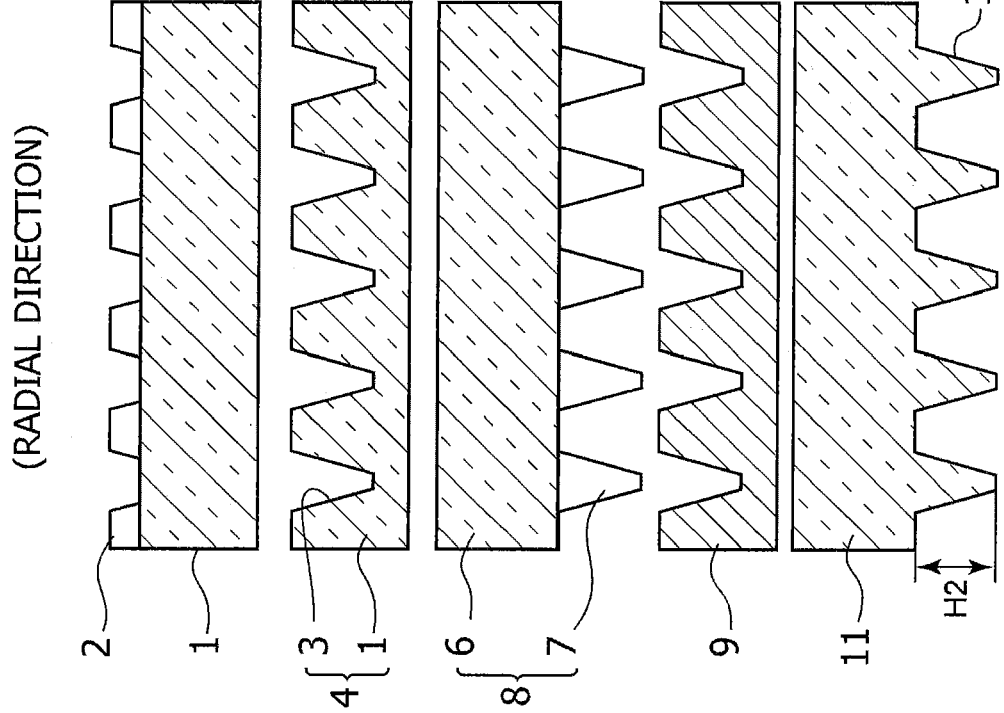

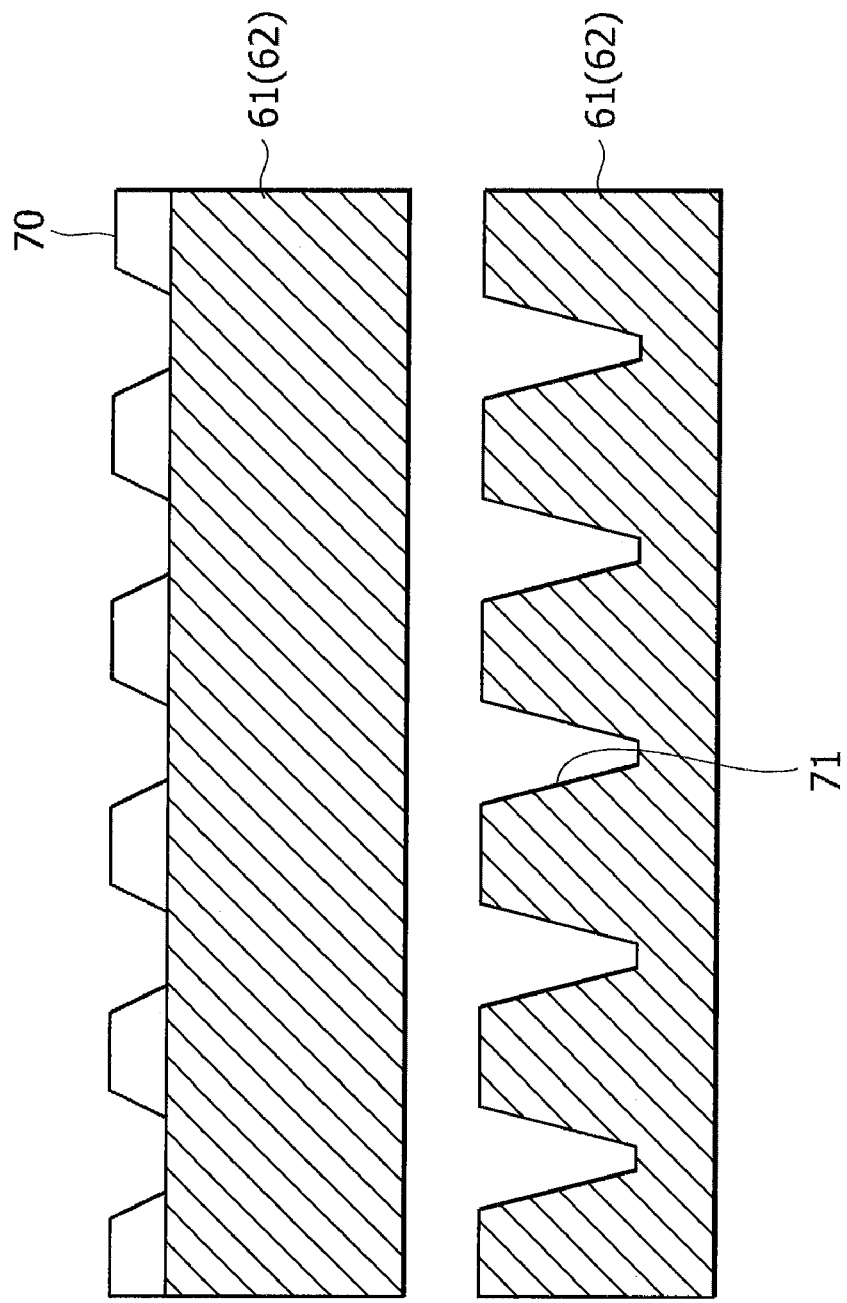

FIG. 11

| | REPLICATION SUBSTRATE A1 | REPLICATION SHEET B1 | REPLICATION SUBSTRATE C1 | MOLDING SUBSTRATE A2 | MOLDING SUBSTRATE D2 |
|---|---|---|---|---|---|
| ETCHING TIME | 16MINUTES | 11MINUTES | 20MINUTES | 16MINUTES | 18MINUTES |
| PATTERN HEIGHT H1 IN THE CIRCUMFERENCE DIRECTION | 271nm | 211nm | 305-327nm | 274nm | 298nm |
| PATTERN HEIGHT H2 IN THE CIRCUMFERENCE (60 DEGREE) DIRECTION | 351nm | 257nm | 389-452nm | 358nm | 372nm |
| PITCH P1 IN THE CIRCUMFERENCE DIRECTION | 330nm | 330nm | 330nm | 330nm | 350nm |
| PITCH P2 IN THE CIRCUMFERENCE (60 DEGREE) DIRECTION | 300nm | 300nm | 300nm | 300nm | 300nm |
| AVERAGE PITCH P | 310nm | 310nm | 310nm | 310nm | 317nm |
| ASPECT RATIO H/P | 1.13 | 0.83 | 1.25-1.46 | 1.15 | 1.17 |
| ASPECT RATIO H1/P1 IN THE CIRCUMFERENCE DIRECTION | 0.82 | 0.64 | 0.92-0.99 | 0.83 | 0.85 |
| ASPECT RATIO H2/P2 IN THE CIRCUMFERENCE (60 DEGREE) DIRECTION | 1.17 | 0.86 | 1.30-1.51 | 1.19 | 1.24 |
| PITCH RATIO P1/P2 | 1.10 | 1.10 | 1.10 | 1.10 | 1.17 |
| ANGLE θ | 57° | 57° | 57° | 57° | 54° |

FIG. 17

| | REPLICATION SUBSTRATE A1 | MOLDING SUBSTRATE A2 | REPLICATION SUBSTRATE E1 | REPLICATION SUBSTRATE F1 |
|---|---|---|---|---|
| ETCHING TIME | 16MINUTES | 16MINUTES | 18MINUTES | 12MINUTES |
| PATTERN HEIGHT H1 IN THE CIRCUMFERENCE DIRECTION | 271nm | 274nm | 346nm | 245nm |
| PATTERN HEIGHT H2 IN THE CIRCUMFERENCE (60 DEGREE) DIRECTION | 351nm | 358nm | 396nm | 272nm |
| PITCH P1 IN THE CIRCUMFERENCE DIRECTION | 330nm | 330nm | 330nm | 315nm |
| PITCH P2 IN THE CIRCUMFERENCE (60 DEGREE) DIRECTION | 300nm | 300nm | 300nm | 275nm |
| AVERAGE PITCH P | 310nm | 310nm | 310nm | 288nm |
| ASPECT RATIO H/P | 1.13 | 1.15 | 1.28 | 0.94 |
| ASPECT RATIO H1/P1 IN THE CIRCUMFERENCE DIRECTION | 0.82 | 0.83 | 1.05 | 0.78 |
| ASPECT RATIO H2/P2 IN THE CIRCUMFERENCE (60 DEGREE) DIRECTION | 1.17 | 1.19 | 1.32 | 0.99 |
| PITCH RATIO P1/P2 | 1.10 | 1.10 | 1.10 | 1.15 |
| ANGLE θ | 57° | 57° | 57° | 55° |

FIG. 21

| | REPLICATION SUBSTRATE F1 | REPLICATION SUBSTRATE G1 | SOLAR CELL H |
|---|---|---|---|
| ETCHING TIME | 12 MINUTES | 10 MINUTES | 18 MINUTES |
| PATTERN HEIGHT H1 IN THE CIRCUMFERENCE DIRECTION | 245nm | 198nm | 209nm |
| PATTERN HEIGHT H2 IN THE CIRCUMFERENCE (60 DEGREE) DIRECTION | 272nm | 236nm | 251nm |
| PITCH P1 IN THE CIRCUMFERENCE DIRECTION | 315nm | 300nm | 330nm |
| PITCH P2 IN THE CIRCUMFERENCE (60 DEGREE) DIRECTION | 275nm | 265nm | 300nm |
| AVERAGE PITCH P | 288nm | 277nm | 310nm |
| ASPECT RATIO H/P | 0.94 | 0.85 | 0.81 |
| ASPECT RATIO H1/P1 IN THE CIRCUMFERENCE DIRECTION | 0.78 | 0.66 | 0.63 |
| ASPECT RATIO H2/P2 IN THE CIRCUMFERENCE (60 DEGREE) DIRECTION | 0.99 | 0.89 | 0.84 |
| PITCH RATIO P1/P2 | 1.15 | 1.13 | 1.10 |
| ANGLE $\theta$ | 55° | 56° | 57° |

|  | EXAMPLE 8 | EXAMPLE 9 | EXAMPLE 10 |
|---|---|---|---|
| PATTERN DEPTH | 420nm | 420nm | NO PATTERN |
| CYCLE | 330nm | 330nm | NO PATTERN |
| ASPECT RATIO | 1.27 | 1.27 | NO PATTERN |
| SKIRT PORTION | PRESENCE | ABSENCE (VERTICAL FORM) | NO PATTERN |

PRIOR ART

PRIOR ART

PRIOR ART

OPTICAL DEVICE, METHOD FOR PRODUCING MASTER FOR USE IN PRODUCING OPTICAL DEVICE, AND PHOTOELECTRIC CONVERSION APPARATUS

CROSS REFERENCE TO RELATED APPLICATIONS

The present application claims priority to Japanese Patent Document Nos. P2006-224173 filed on Aug. 21, 2006, and P2006-338787 filed on Dec. 15, 2006 the disclosures of which are herein incorporated by reference.

BACKGROUND

The present invention relates to an optical device which has on its surface a number of structures with a higher portion or a lower portion being arranged at a fine pitch equal to or shorter than the wavelength of visible light, a method for producing a master for use in producing an optical device, and a photoelectric conversion apparatus.

There have been optical devices using a translucent base material such as glass or a plastic, and having a surface treated to suppress the surface reflection by light. As a surface treatment of this type, there is a method in which an optical device has a fine, dense uneven (moth eye) shaped surface formed thereon (see, for example, "Phototechnology Contact", Vol. 43, No. 11 (2005), 630-637).

Typically, in an optical device having a surface with periodic unevenness shaped thereon, when light passes through the uneven surface of the optical device, diffraction of light occurs, and the straight component of the transmitted light is considerably reduced. However, when the pitch of the uneven shape is shorter than the wavelength of light which passes through, no diffraction occurs, and thus, effective anti-reflection properties can be obtained.

An optical device having the surface structure is shown in FIG. 29 (see, for example, Japanese Patent Application Publication No. JP 2003-294910). An optical device 101 has a configuration in which a number of conical and higher structures 103 are arranged on the surface of a base 102 at a fine pitch equal to or shorter than the wavelength of light (visible light). In the optical device 101 having the above surface structure, a gentle change of the refractive index is caused at an interface between the slope portions of structures 103 and the air layer to effectively prevent the reflection of the incident light from the surface of the base 102. The form of the structures 103 is not limited to the higher form and a similar effect can be obtained, even when the structures are formed of lower portions.

Further, with respect to the structures 103, a variety of cross-sectional forms and arrangements are proposed. For example, in the optical device 101 shown in FIG. 28, each of the structures 103 having the shown form is a lattice unit arranged to form a square lattice pattern. On the other hand, for example, in Japanese Patent Application Publication No. JP 2004-317922, an example is disclosed in which, as shown in FIG. 30, structures 104 are arranged to form a regular hexagonal lattice pattern. Further, in Japanese Patent Application Publication No. JP2004-317922, an example is shown in which structures have conical forms.

By the way, with respect to the production of the optical devices, a replica substrate is formed from a master prototype (master) having a surface microstructure constituting each structure, and further a molding die is formed from the replica substrate. By the above, it is expected that the optical devices are mass-produced at low cost by molding. Specifically, an ultraviolet-cured replica substrate is formed by using a single master prototype, and a molding die is formed from the replica substrate by a plating technique, and whereby optical devices formed of, e.g., a polycarbonate resin can be mass-produced by injection molding using the molding die.

The master prototype is produced as follows. A resist is applied on a substrate, and subjected to exposure and development processing to form a resist pattern, followed by dry etching using this resist pattern as a mask. Then, the resist pattern (or mask pattern) is removed to form an uneven surface structure in which structures with a higher portion or a lower portion are arranged at a fine pitch on the surface of the substrate. It is noted, as a substrate material forming the master prototype, an inorganic material, such as quartz, or the like may be used.

For the production of the master prototype, highly precise shape same level with that of the fine resist pattern formed on the surface of the substrate. As a technique for forming a pattern at a fine pitch equal to or shorter than the wavelength of visible light with high precision, for example, electron beam exposure is known.

As a moth eye structure formed by the electron beam exposure, fine tent-form moth eye structures (pitch: about 300 nm; depth: about 400 nm) shown in FIG. 31 are disclosed (see "Mold die master for anti-reflective structure (moth eye) free of the wavelength dependency", NTT Advanced Technology Corporation. The moth eye structures seem to be produced by a method in which an uneven pattern is formed by electron beam recording performed to a photoresist on a Si (silicon) substrate, and the resultant substrate is subjected to anisotropic etching for the Si substrate surface using the uneven photoresist pattern as a mask. The moth eye structures is formed to be a hexagonal lattice as shown in FIG. 32, and whereby anti-reflection effects (reflectance: 1% or less) with very high functions in the wavelength range of visible light is obtained. FIG. 33 shows the wavelength dependency characteristics of the reflectance with respect to the Si master.

However, the electron beam exposure has a disadvantage in that operation hours are long, and hence it is not suitable for the industrial production. For example, in the electron beam exposure using an electron beam at 100 pA, which is used in drawing the finest pattern, for a resist which requires dose amounts of several tens $mC/cm^2$, such as Calixarene, even if the exposure is continued for 24 hours, an area of a square having one side of 200 µm cannot be filled. Further, the electron beam exposure for an area of a 2.5-inch small-size display (50.8 mm×38.1 mm) of currently typically used mobile phones requires around 20 days.

Therefore, a technique for producing a master prototype at low cost in short hours is desired. To meet this demand, a technique for producing the master prototype by laser exposure is proposed. Specifically, various techniques for producing the master prototype utilizing a mastering technique of optical disc are considered.

For example, an optical device having a nanometer-size microstructure (low-reflective moth eye structure) formed on a disc-form Si substrate having a diameter of 12 cm by utilizing the mastering technique of optical disc is disclosed (see "Development of a Desktop Apparatus Enabling Nanometer-scale Fine Processing", National Institute of Advanced Industrial Science and Technology. This document indicates that according to this method, a dot pattern of 50 nm, which corresponds to one sixth or less of the size of a laser beam spot, can be formed at a speed of 6,000,000 dots/s by irradiation with a laser beam at a pulse frequency of 60 MHz while rotating the substrate at a speed of 6 m/s. FIG. 34 shows an example of forming a nanodot pattern of this optical device.

Further, a method is disclosed in which six spots are formed at each apex of a regular hexagonal shape in a photoresist layer on a surface of a glass master by parallelly separating a laser beam into six laser beams using a phase diffraction grating having regular triangle patterns and a sawtooth diffraction grating having six regions, and causing the six laser beams converged into a single spot by an objective lens to be interfered each other (for example, Japanese Patent Application Publication No. JP 2003-131390).

However, an optical device produced by the technologies has poor wavelength dependency characteristics of the reflectance, and cannot realize a low reflectance of 1% or less, and therefore it is not suitable to be put into practical use as an anti-reflection structure. The reason for this is presumed that the optical device has a low density (50% or less) of the nano dot pattern (opening ratio) and a large Fresnel reflection in the plane region of the pattern-non-formed portion. FIG. 35 shows reflection properties of the optical device shown in FIG. 34.

The present invention is made in view of the issues and aims to provide an optical device that has a high productivity and an excellent anti-reflection property, a method for producing a master for use in producing an optical device and a photoelectric conversion apparatus.

SUMMARY

The present inventors have made intensive studies to solve the issues in the prior art. The summaries of them are described below.

Inventors of the present invention have studied with respect to an optical device produced by applying a mastering technique of optical disc, namely, an optical device in which structures are arrayed in an arc shape (circumferential shape), in order to improve the anti-reflection property thereof.

Typically, in the technical filed of the above-mentioned optical device, form of a structure to be provided in an optical device is desired have a cone shape having a circle bottom in order to improve the anti-reflection property. In addition, such shape is considered as an ideal shape for obtaining the anti-reflection property. Further, in order to increase a packing density of structures having the shape, it is desirable that the structures are arranged in a regular hexagonal lattice form.

However, according to the knowledge of the inventors, in the optical device formed by applying the mastering technique of optical disc, it is difficult to form the structure to be the ideal cone shape, and, in view of actual productivity, it is advantageous to form the structure in an elliptical cone shape with the ellipse bottom having a major axis in a circumferential direction.

Further, according to the knowledge of the present inventors, an optical device having the elliptical cone shaped structures can have anti-reflection property substantially same with that of an optical device having general cone shaped structures.

Therefore, the present inventors have studied with respect to the optical device having the elliptical cone shaped structures to improve the anti-reflection property. Specifically, they have studied to increase the packing density of the structures arranged in a hexagonal lattice shape. As a result, the inventors have found that, in the laser exposure to which a mastering technique of optical disc is applied, the height (depth) of the structures in a circumferential direction become small as the gap between the structures becomes narrow, and an arrangement pitch P1 in a circumferential direction and an arrangement pitch P2 of the structures arranged in the adjacent two tracks may not be set to a similar short pitch, and thus, it is difficult to arrange the structures in a regular hexagonal lattice shape.

Therefore, the present inventors have studied to find an alternative arrangement of the structures to replace the arrangement in the regular hexagonal lattice shape. As a result, they have found that the structures are to be arranged in a quasi-hexagonal lattice shape distorted and enlarged in the circumferential direction.

Further, if the structure has an elliptical cone shape, the packing density in radial direction can be heightened by arranging the structures in a quasi-hexagonal lattice shape instead of arranging in a hexagonal lattice shape when the structures have elliptical cone shape.

The present invention is made based on the studies.

More specifically, an optical device according to the present invention is characterized in that on a surface of a base, a number of structures having higher portions or lower portions are arranged at a fine pitch equal to or shorter than the wavelength of light. Each of structure is arranged to constitute a plurality of arc tracks on a surface of a base, and form a quasi-hexagonal lattice pattern. The structure has an elliptical cone or truncated elliptical cone shape having a major axis in a circumferential direction of the arc tracks.

A method for producing a master for use in forming an optical device according to the present invention is a method for producing a master for use in forming an optical device in which a number of structures having higher portions or lower portions are arranged at a fine pitch equal to or shorter than a wavelength of light. The method is characterized by including a first step for preparing a substrate having a resist layer formed on the surface, a second step for intermittently irradiating the resist layer with a laser beam while rotating the substrate and relatively moving the laser beam in the radial direction of the rotation of the substrate to form a latent image having elliptical shape at a pitch shorter than the wavelength of visible light, and a third step for developing the resist layer to form a resist pattern on the surface of the substrate. In the second step, the latent image is formed such that a quasi-hexagonal lattice pattern is configured in the adjacent three track rows.

In the present invention, a number of structures arranged on the surface at a fine pitch equal to or shorter than the wavelength of visible light are provided such that they constitute a plurality of arc tracks rows, and form a hexagonal lattice pattern in the adjacent three track rows. Therefore, a high packing density of the structures on the surface can be achieved to improve the anti-reflection efficiency of visible light, and thus to obtain an optical device having both excellent anti-reflection properties and extremely high transmittance. Further, in the formation of the structures, a recording technique of optical disc is utilized, and therefore, a master for use in producing the optical device having the construction can be produced efficiently in a short time, and large-scaled substrate can be handled to improve the productivity of the optical device. Also, transmission characteristics can be further improved by providing finely arranged structures at light emitting surface in addition to light incident surface.

Further, in the present invention, in the second step, the laser beam irradiation to the resist layer is performed while changing an irradiation cycle per each track, and whereby structures (latent image) can be arranged and formed to constitute a quasi-hexagonal lattice pattern in the adjacent three track rows. With respect to the laser beam irradiation period, for example, the substrate is rotated at a constant angular velocity, and the pulse frequency of the laser beam is optimized such that the pitch of the structures arranged in the circumferential direction becomes constant. Specifically, the modulation is controlled such that the irradiation period of laser beam becomes short as track position becomes distant from the center of the substrate. This enables formation of a nanopattern in which the spatial frequency is uniform over the whole substrate.

The latent image formed by the method is developed, and etching using the thus obtained resist pattern as a mask is performed to obtain structures of an elliptical cone shape or truncated elliptical cone shape having a major axis in the circumferential direction of the arc tracks. It is especially preferable that each structure of an elliptical cone shape or truncated elliptical cone shape has a slope at the middle portion which is steeper than the slopes at the tip end portion and bottom portion to enable improvement of the durability and transfer performance.

Further, by the method, a quasi-hexagonal lattice pattern in which an arrangement pitch of the structures on the same track is longer than an arrangement pitch of the structures between the adjacent two tracks can be obtained, and whereby the packing density of the structures may be further improved.

The optical device having the construction according to the present invention can be used as a light guide plate or light guide window in various optical devices, such as displays, solar cells, and illuminating devices, and the like. Thus, an optical device having a little surface reflection and excellent light utilization efficiency can be achieved.

In particular, a photoelectric conversion apparatus according to the present invention is characterized by including a photoelectric conversion layer, and a light-transmissive optical device provided at a light receiving portion of the photoelectric conversion layer. The optical device has a number of structures having higher portions or lower portions arranged at a fine pitch equal to or shorter than a wavelength of visible light on a light receiving surface, and each of the structures is arranged to constitute a plurality of arc track rows on the light incident surface, and to form a quasi-hexagonal lattice pattern. The structure has an elliptical cone or truncated elliptical cone shape having a major axis in a circumferential direction of the arc tracks.

With the construction, it is possible to construct a photoelectric conversion apparatus including a light receiving portion having an excellent light transmittance property in a wide wavelength range, and therefore, the light utilization efficiency can be increased and the power generation efficiency in a photoelectric conversion potion can be improved.

As described above, according to the present invention, it is possible to obtain an optical device with excellent anti-reflection properties and extremely high transmittance.

BRIEF DESCRIPTION OF THE FIGURES

FIG. 1 is diagram showing schematic construction of an optical device according to a first embodiment of the present invention, wherein

FIG. 6A to 6E are schematic views for explaining the steps for producing a replica substrate, a molding die, and an optical device from the master for use in producing an optical device according to the present invention, FIGS. 10A and 10B are schematic views of main portions for explaining an example in which the present invention is applied on the surface of an Si substrate of the silicon solar cell, FIG. 11 is a table showing the production conditions of each sample prepared in a second example of the present invention, FIG. 17 is a table showing the production conditions of each sample prepared in a fifth example of the present invention, FIG. 21 is a table showing the production conditions of each sample prepared in a sixth example of the present invention.

DETAILED DESCRIPTION

Hereinafter, each of embodiments of the present invention is described with reference to the accompanying drawings. It is noted that the present invention is not limited to each of the following embodiments and various modification is allowable on the basis of the technical concept of the present invention.

First Embodiment

Figure 1A:
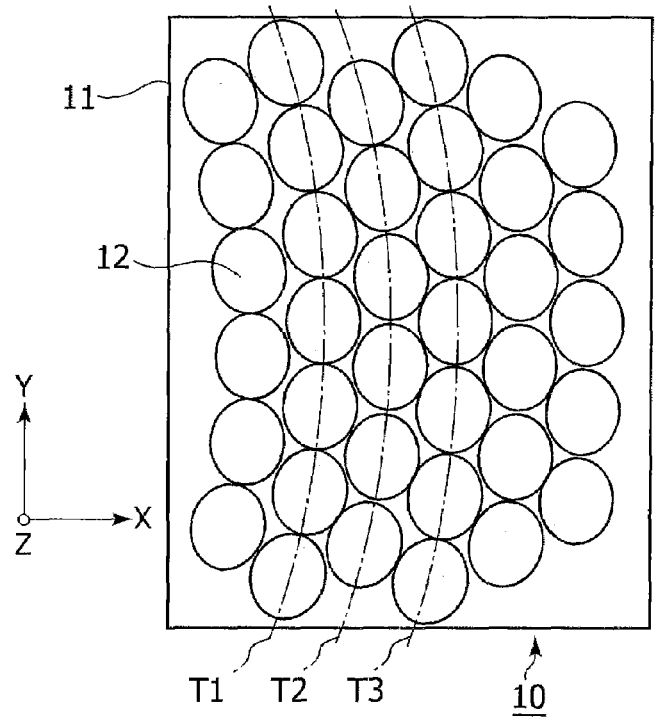
FIG. 1A is a main portion top view.
Figure 1B:
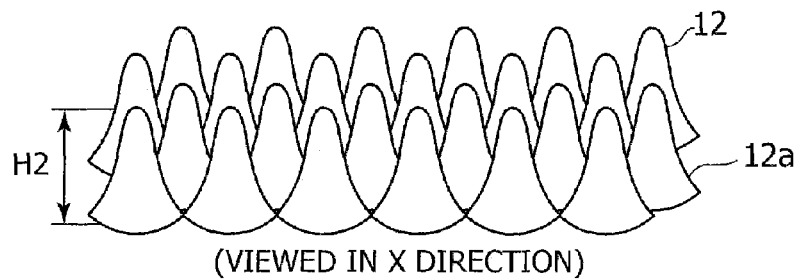
FIG. 1B is a main portion perspective view as viewed from the X direction in FIG. 1A.
Figure 1C:
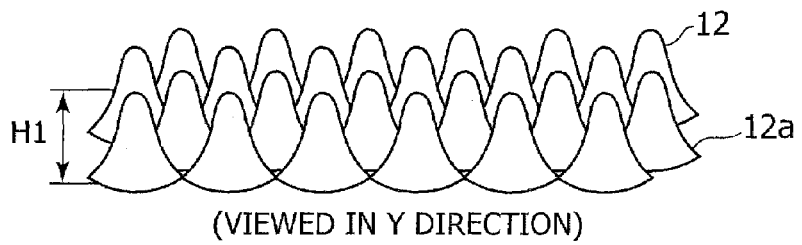
FIG. 1C is a main portion perspective view as viewed from the Y direction in FIG. 1A.

FIG. 1 is diagrammatic views showing the construction of an optical device 10 according to a first embodiment of the present invention. Here, FIG. 1A is a main portion top view of the optical device 10, FIG. 1B is a main portion perspective view of the optical device 10 viewed from the X direction in FIG. 1A, and FIG. 1C is a main portion perspective view of the optical device 10 viewed from the Y direction in FIG. 1A.

The optical device 10 according to the present embodiment has, a configuration (subwavelength configuration) in which a number of structures 12 having higher portions are arranged at a fine pitch equal to or shorter than the wavelength of visible light on the surface of a base 11. Here, the terms "a wavelength equal to or shorter than the wavelength of visible light" used here is a wavelength equal to or shorter than around 400 nm. The optical device 10 has a function of preventing the reflection at an interface between the structures 12 and the surrounding air with respect to the light which passes through the base 11 in the Z direction in FIG. 1A.

The base 11 is a transparent base including light transmission properties, e.g., a transparent synthetic resin, such as polycarbonate (PC) or polyethylene terephthalate (PET), or glass and the like, and with respect to the form of the base, there is no particular limitation, and the base may be in a film form, sheet form, plate form, or block form. Specifically, the optical device 10 according to the present embodiment is applied to various optical devices requiring a predetermined light transmission characteristics (anti-reflection function), such as displays, photoelectronics, optical communications, solar cells, and illuminating devices, and the like. The form of the base 11 is determined depending on the form of the main body of the optical device or the sheet- or film-form light guiding members fitted to the optical device.

The structures 12 are, for example, unified with the base 11. The individual structures 12 have the same shape respectively, but they are not limited to this. It is preferable that the structures 12 has an elliptical cone shape in which the bottom is an elliptical, oblong, or oval shape having a long axis and a short axis to form a conical shape and the top is curved, or, a conical structure of a truncated elliptical cone shape in which the bottom is in an elliptical, oblong, or oval form having a long axis and a short axis and the top is flat. It is because such shapes can improve the packing density in the radial direction. Further, from the viewpoint of improving the reflection property and transmission characteristics, it is preferred that structures 12 have a truncated elliptical cone shape having a slope at the middle portion steeper than the slopes at the bottom portion and top portion (see FIGS. 1B and 1C), or truncated elliptical cone shape having a flat top portion (see FIG. 16).

The structures 12 are not limited to higher portion shown in the figures, and the structures may include lower portions formed on the surface of the base 11. With respect to the height (depth) of the structures 12, there is no particular limitation, and may be arbitrarily set according to the wavelength range of light to be passed through, for example, in a range of about 236 nm to 450 nm.

An aspect ratio (height/arrangement pitch) of the structures 12 is preferable to be set in a range of 0.81 to 1.46, and more preferably in a range of 0.94 to 1.28. If the aspect ratio is less than 0.81, the reflection property and transmission characteristics tend to be lowered and if the aspect ratio exceeds 1.46, a exfoliation property is lowered in a process for producing an optical disc, and thus, a duplication of a replica tends to be difficult to remove properly.

Further, from the viewpoint of improving the reflection property, the aspect ratio of the structures 12 is preferably set in a range of 0.94 to 1.46.

Further, from the viewpoint of improving the transmission characteristics, the aspect ratio of the structures 12 is preferably set in a range of 0.81 to 1.28.

To be noted that the aspect ratio in the present invention is defined by the following expression (1).

$$\text{The aspect ratio} = H/P \tag{1}$$

where H: the height of the structure, and P: average arrangement pitch (average period).

The average arrangement pitch P used here is defined by the following expression (2).

$$\text{The average arrangement pitch } P = (P1 + P2 + P2)/3 \tag{2}$$

where P1: the arrangement pitch (circumferential 60° period) in the circumferential direction (circumferential period), and P2: the arrangement pitch in a ±θ direction to the circumferential direction (where θ=60°−δ, δ used here is preferably set in a range of 0°<δ≦11°, and more preferably set in a range of 3°≦δ≦6°).

Further, the height H of the structure is a height in the radial direction of the structures 12. Since the height of the structure in the circumferential direction is smaller than the height in the radial direction, and, in addition, the height of the portion other than the portion in the circumferential direction of the structure 12 is substantially same with the height in the radial direction, and therefore a depth of the sub-wavelength structure is represented by the height in the radial direction. However, if the structures 12 are lower portions, the height H of the structure in the expression (1) is the depth H of the structure.

Further, it is not requisite that all the structures 12 have the same aspect ratio, and each structure may have a certain height distribution (for example, an aspect ratio in a range of from 0.83 to 1.46). By providing the structures 12 having a certain height distribution, the wavelength dependency characteristics of the reflectance characteristic can be lowered. Therefore, the optical device having the excellent anti-reflection property may be realized.

The terms "the height distribution" used here means that the structures 12 having more than two kinds of heights (depths) are provided on the surface of the base 11. In other words, it means that the structures 12 having the height serving as a reference height and the structures 12 having the height different from the reference height are provided on the surface of the base 11. Structures 3 having the height different from the reference height are provided, for example, on the surface of a base 2 periodically or a periodically (random). As a direction of the periodicity, for example, there are the circumference direction, radial direction and the like.

Further, as shown in FIGS. 1B and 1C, it is preferable to provide a skirt portion 12a at the outer edge portion of the structure 12. It is because this makes possible to remove the optical disc easily from a mold, or the like, in a process for producing an optical disc. Further, from the viewpoint of the exfoliation property, the skirt portion 12a is preferably formed as a gently inclined curved surface.

It is noted that the skirt portion 12a may be provided a portion of the outer edge portion of the structure 12, but from the viewpoint of improving the above exfoliation property, the skirt portions 12a are preferable to be provided at all outer edge portions of the structures 12. Further, if the structures 12 are the lower portions, the skirt portions 12a become curved surfaces provided at the outer edge portions of openings of the lower portions which are the structures 12.

Figure 2:
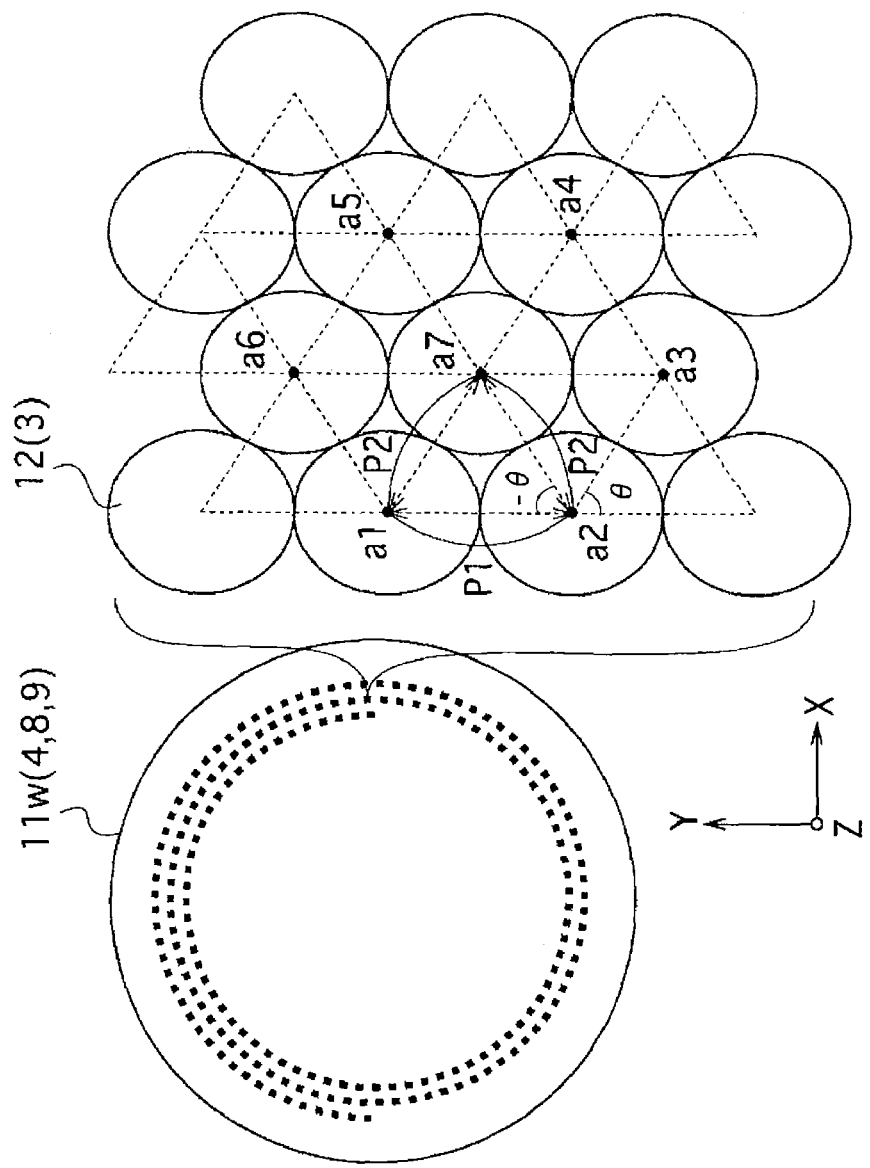
FIG. 2 is a enlarged top schematic view of mother substrate of the optical device and its main portion shown in FIG. 1, FIG. 3A to 3B are diagrams showing examples of optical device according to the present invention cut out from the from the mother substrate shown in FIG. 2, FIG. 4A to 4E are schematic views for explaining a method for producing a master for use in producing an optical device according to the present invention.
Figure 3A:
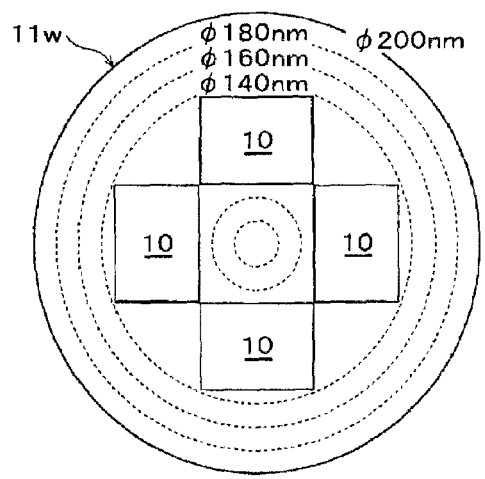
Figure 3B:
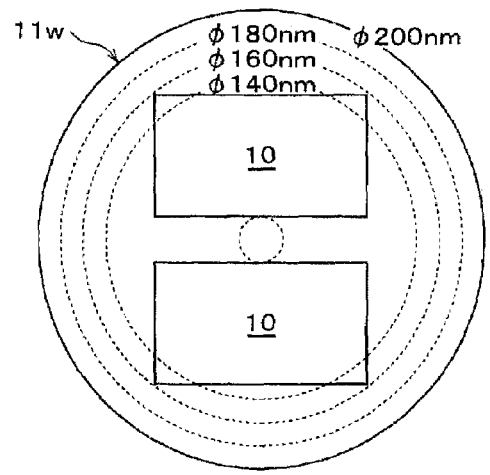

As shown in FIG. 2, the bases 11 are formed almost all over the surface of a disc-shaped substrate 11W and cut into a form according to a predetermined product size from the substrate 11W as shown in FIGS. 3A and 3B. The structures 12 are formed based on an exposed pattern formed on the substrate 11W using the optical disc recording apparatus (described late) Therefore, when the substrates 12 are cut into a predetermined size from the substrate 11W, as shown in FIG. 1A, each structure 12 is arranged such that they constitute a plurality of arc tracks rows T1, T2, T3, . . . (hereinafter, these are collectively referred to as "tracks T") on the surface of the base 11. By employing such arrangement, the structures 12 can be produced by utilizing the mastering technique of optical disc, and thus, the productivity of the optical disc can be improved, as compared with the related art technique. Further, the transmission characteristics and reflection property in an arc-shaped arrangement are not different from those of a linear-shaped arrangement.

In this instance, each structure 12 is arranged such that the major axe direction of the bottoms is directed toward the circumferential direction of the tracks T. Further, each structure 12 has at the bottom the skirt portion 12a extending in the circumferential direction of the arc tracks T as shown in FIG. 1B. It is preferred that a height H1 of the structures 12 in the circumferential direction of the tracks T (viewed in the Y direction) is smaller than a height H2 of the structures 12 in the radial direction of the arc tracks T (viewed in the X direction). More specifically, it is preferred that the heights H1 and H2 of the structures 12 satisfy the relationship of H1<H2. Because if the structures 12 are arranged to satisfy the relationship of H1≧H2, the arrangement pitch P1 in the circumferential direction is required to be set long, and accordingly the packing density of the structures 12 in the circumferential direction becomes lowered. When the packing density is lowered as above, the reflection property may be lowered.

With respect to each structure 12, in the adjacent two tracks T, at the center position (at the position shifted by half pitch) of each structure 12 arranged on one track (e.g., T1), the structures 12 on the other track (e.g., T2) are arranged. Consequently, as shown in FIG. 2, in the adjacent three tracks (T1 to T3), each structures 12 is arranged to form a quasi-hexagonal lattice pattern with the centers of the structures 12 respectively positioned at points a1 to a7. The terms "quasi-hexagonal lattice pattern" used here does not mean the regular hexagonal lattice pattern but mean a hexagonal lattice pattern distorted along the arc of the tracks T and stretched and distorted in the circumferential direction. By arranging the structures 12 having an elliptical cone or truncated elliptical cone shape in the quasi-hexagonal lattice pattern, the packing density rate in the radial direction may become high, as compared with the arrangement of the above shaped structures 12 in the regular hexagonal lattice pattern.

When each structure 12 is arranged to form the quasi-hexagonal lattice pattern, as shown in FIG. 2, the arrangement pitch P1 (e.g., distance between a1-a2) of each structure 12 on the same track (e.g., T1) becomes longer than the arrangement pitch P2 of the structures 12 between the adjacent two tracks (e.g., T1 and T2), that is, the arrangement pitch P2 (e.g., distance between a1-a7 or a2-a7) of the structures 12 in the ±θ direction to the circumferential direction (where θ=60°−δ, δ used here is preferably set in a range of 0°<δ≦11°, and more preferably set in a range of 3≦δ≦6°).

Each structures 3 on the same track is provided, for example, at a certain arrangement pitch P1 (e.g., distance between a1-a2). The arrangement pitch P1 is preferably set in a range of about 300 nm to 350 nm, and more preferably set in a range of 315 to 350 nm, and a pitch of, for example, about 330 nm is selected. If the arrangement pitch P1 is less than 300 nm, the lower portions between the structures will be shallow and the reflection property is lowered, but if it exceeds 350 nm, the lower portions between the structures are widen and flat portions are generated between the structures, and thus, the reflection property tends to be lowered. Further, in the ±θ direction to the circumferential direction (where θ=60°−δ, δ used here is preferably set in a range of 0°<δ≦11°, and more preferably set in a range of 3°≦δ≦6°), each structures 3 is provided at a certain pitch P2 (e.g., distance between a1-a7 (a2-a7)), the arrangement pitch P2 is preferable to set in a range of about 265 to 300 nm, and a pitch of, for example, about 300 nm is selected. If the arrangement pitch P2 is less than 265 nm, the lower portions between the structures become shallow and the reflection property is lowered, but if it exceeds 300 nm, the lower portions between the structures are widen and flat portions are generated between the structures, and thus, the reflection property tends to be lowered.

An arrangement pitch ratio P1/P2 is preferably set in a range of 1.00<P1/P2≦1.32, more preferably set in a range of 1.05≦P1/P2≦1.20, and most preferably set in a range of 1.10≦P1/P2≦1.17. If the ratio P1/P2 is 1.00 or less, the lower portions between the structures become shallow and the reflection property is lowered, and if the ratio P1/P2 exceeds 1.32, the lower portions between the structures are widened and flat portions are generated between the structures, and thus, the reflection property is lowered.

An array structure of the structures 12 having the construction is not limited to a case forming the structures 12 on the surface of the base 11, and the structures 12 can be formed also on the rear surface of the base 11. In this case, it is possible to obtain the anti-reflection function for both light incident surface and light exit surface of the base 11 through which light passes, and further improve the transmittance property. In the present embodiment, the array configuration of the structures 12 is provided at least on a light entrance surface side.

Next, a method for producing the optical device 10 having the construction is described. In the present embodiment, the optical device 10 having the construction is produced through a process of producing a master for use in forming an optical device, a process of producing a replica substrate for use in forming an optical device, a process of producing a mold for use in forming an optical device, and a process of forming an optical device.

FIG. 4A to 4E are schematic views for explaining the process for producing a master for use in forming an optical device.

Figure 4A:
Figure 4B:
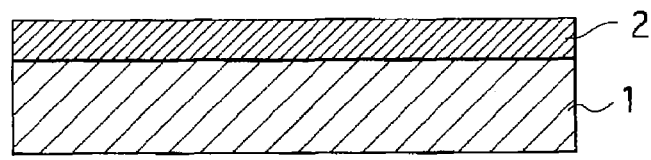

First, as shown in FIG. 4A, a disc-form (disc-shape) quartz substrate 1 is provided. Then, as shown in FIG. 4B, a resist layer 2 is formed on the surface of the quartz substrate 1. The resist layer 2 may be formed of either an organic material or an inorganic material. As an organic type resist, for example, a novolak type resist or a chemically amplifying type resist can be used. Further, as an inorganic type resist, for example, metal oxide materials including at least one or two transition metal, such as tungsten or molybdenum, is preferred.

Figure 4C:
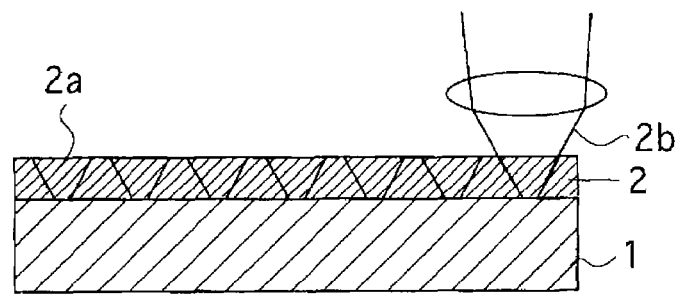

Then, as shown in FIG. 4C, while rotating the quartz substrate 1, the resist layer 2 is irradiated by a laser beam (exposure beam) 2b. In this instance, the resist layer is intermittently irradiated by a laser beam while moving the laser beam 2b in the radial direction of the quartz substrate 1, such that the entire surface of the resist layer 2 is exposed.

Thus a latent image 2a in accordance with the locus of the laser beam 2b is formed on the entire surface of the resist layer 2, at a pitch shorter than the wavelength of visible light. The details of the exposure step are descried later.

Figure 4D:
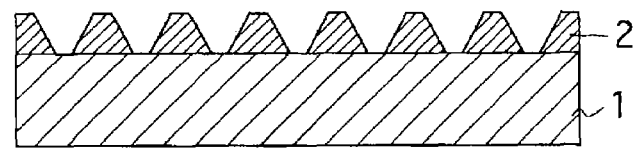

Next, while rotating the quartz substrate 1, a developer is applied in drops onto the resist layer 2 to develop and process the resist layer 2 as shown in FIG. 4D. As shown in the figure, when the resist layer 2 is formed from a positive type resist, the portion exposed by the laser beam 2b has an increased dissolution speed of the developer, as compared with the unexposed portion, and therefore a pattern in accordance with the exposed portion (latent image 2a) is formed in the resist layer 2.

Figure 4E:
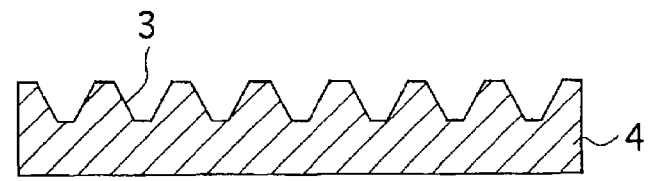

Then, the surface of the quartz substrate 1 is subjected to etching processing using the pattern of the resist layer 2 (resist pattern) formed on the quartz substrate 1 as a mask to form a lower portion pattern 3 shown in FIG. 4E. The etching is conducted by dry etching. In this instance, when the etching processing and ashing processing are alternately performed, not only the shown pattern of conical lower portions 3 can be formed, but also a quartz master having a depth three times or more of the resist layer (selective ratio: 3 or more) can be produced to realize increased aspect ratio of structures.

As described above, a master 4 for use in forming an optical device in the present embodiment is produced. The master 4 is a master for forming the optical device 10 shown in FIG. 1, and an uneven surface structure having the lower portion 3 forms the structures 12 of the optical device 10 utilizing the below-mentioned replica substrate and molding die. Therefore, the lower portions 3 of the master 4 are arranged to form a quasi-hexagonal lattice pattern distorted in the circumferential direction of the master 4.

Figure 5:
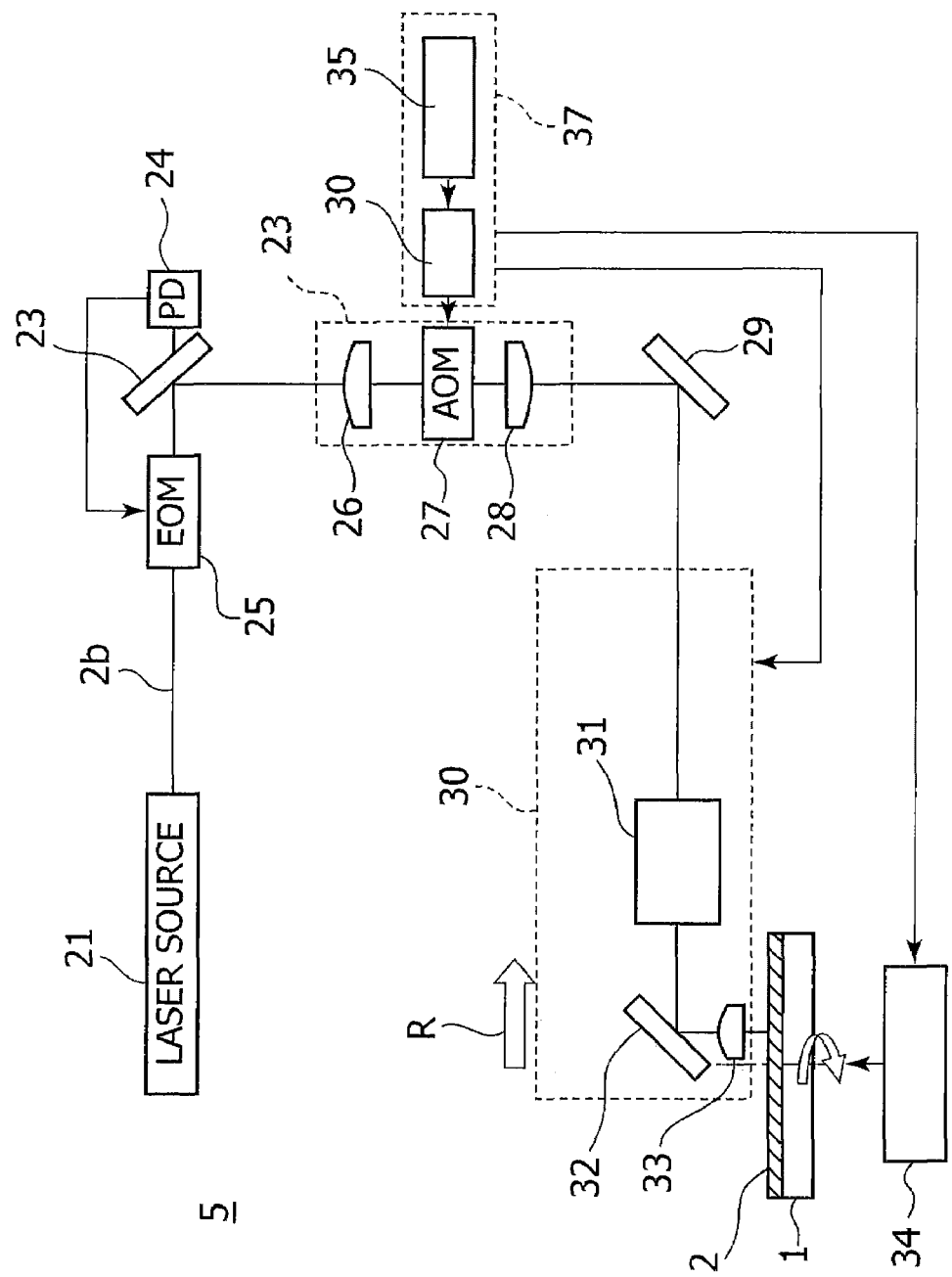
FIG. 5 is a diagrammatic view showing the construction of an exposure apparatus used in one process for producing a master for use in producing an optical device according to the present invention.

Next, the details of the exposure step shown in FIG. 4C are described with reference to FIG. 5. FIG. 5 is a diagrammatic view showing the construction of an exposure apparatus 5. In the present embodiment, the exposure apparatus 5 is constructed based on an optical disc recording apparatus.

With reference to FIG. 5, a laser source 21 is a light source for exposure of the resist layer 2 formed on the surface of the quartz substrate 1, and oscillates, e.g., a far ultraviolet laser beam 2b having a wavelength λ of 266 nm. The laser beam 2b emitted from the laser source 21 forms a Film as a collimated beam and enters an electro-optic modulator (EOM) 25. The laser beam 2b which passed through the EOM 25 is reflected at a mirror 22 and is introduced to a modulation optical system 23.

The mirror 22 includes a polarized-beam splitter, and has a function of reflecting one polarized component and transmitting the other polarized component. The polarized component transmitted through the mirror 22 is received at a photodiode 24, and the EOM 25 is controlled in response to a received signal to perform phase modulation of the laser beam 2b.

In the modulation optical system 23, the laser beam 2b is converged by a condenser 26 to an acousto-optic modulator (AOM) 27 including quartz ($SiO_2$) or the like. The laser beam 2b is intensity-modulated by the AOM 27 and dispersed, and then collimated by a lens 28. The collimated exposure beam 2b emitted from the modulation optical system 23 is reflected by a mirror 29, and is introduced on a moving optical table 30 as a horizontal and parallel beam.

The moving optical table 30 includes a beam expander 31, a mirror 32, and an objective lens 33. The laser beam 2b introduced to the moving optical table 30 is shaped into a desired beam form by the beam expander 31, and then irradiates the resist layer 2 on the quartz substrate 1 through the mirror 32 and objective lens 33. The quartz substrate 1 is placed on a turntable (not shown) connected to a spindle motor 34. Further, while rotating the substrate 1 and moving the laser beam 2b in the radial direction of the rotation of the substrate 1, the resist layer 2 is intermittently irradiated by the laser beam to perform an exposure step of the resist layer 2. The formed latent image 2a has a substantially elliptical form having a major axis in the circumferential direction. Moving of the laser beam 2b is made by shifting the moving optical table 30 in the direction indicated by an arrow R.

The exposure apparatus 5 shown in FIG. 5 has a control mechanism 37 for forming in the resist layer 2 the latent image 2a formed of the 2-dimensional pattern of quasi-hexagonal lattice shown in FIG. 2. The control mechanism 37 includes a polarity inversion unit 35 for controlling timing of the irradiation on the resist layer 2 by the laser beam 2b, and a driver 36 for controlling the AOM 27 in response to the output of the polarity inversion unit 35.

The control mechanism 37 synchronizes the intensity modulation of the laser beam 2b by the AOM 27, the driving rotational speed of the spindle motor 34, and the moving speed of the moving optical table 30 per each track such that the 2-dimensional pattern of the latent image 2a is spatially linked. The substrate 1 is controlled to be rotated at a constant angular velocity (CAV). Patterning is performed at the appropriate number of revolutions of the substrate 1 by the spindle motor 34, appropriate frequency modulation of laser intensity by the AOM 27, and appropriate feeding pitch of the laser beam 2b by the moving optical table 30. This enables formation of the latent image 2a of a quasi-hexagonal lattice pattern on the resist layer 2.

For example, for obtaining the arrangement pitch P1 of 330 nm in the circumferential direction and the arrangement pitch P2 of 300 nm in the direction at about 60° to the circumferential direction (about −60° direction) as shown in FIG. 2, the feeding pitch may be 251 nm. To be noted that for obtaining P1 of 315 nm and P2 of 275 nm, the feeding pitch may be 226 nm. In addition, for obtaining P1 of 300 nm and P2 of 265 nm, the feeding pitch may be 219 nm.

Further, the control signal of the polarity inversion unit 35 is gradually changed such that the spatial frequency (a pattern density of the latent image 2a: P1: 330, P2: 300 nm; or P1: 315 nm, P2: 275 nm; or P1: 300 nm, P2: 265 nm) becomes uniform. Specifically, the exposure is conducted while changing an irradiation period of the laser beam 2b on the resist layer 2 per each track, and frequency modulation of the laser beam 2b is performed at the control mechanism 37 such that P1 becomes about 330 nm (or 315 nm, 300 nm) on each of the tracks T. That is, the modulation is controlled such that the irradiation period of laser beam becomes short as track position becomes distant from the center of the substrate. This enables formation of a nano pattern in which the spatial frequency is uniform over the whole substrate.

Next, a series of steps for producing the optical device 10 from the master 4 for use in producing an optical device are described with reference to FIG. 6.

FIG. 6A is schematic view for explaining the diagrammatic steps for producing the optical device 10 from the master 4 for use in producing an optical device. As mentioned above, the master 4 for use in producing an optical device is produced by forming a pattern of the resist layer 2 on the surface of the quartz substrate 1 (FIG. 6A), and subjecting the substrate to etching using the resist pattern as a mask to form an uneven structure having the lower portions 3 on the surface of the substrate 1 (FIG. 6B).

Here, in the pattern of the resist layer 2, after the development, the layer thickness in the radial direction of the substrate 1 is different from the layer thickness in the circumferential direction, and the layer thickness in the circumferential direction is thinner than the layer thickness in the radial direction. The reason for this resides in that since the irradiation by the laser beam 2b is performed while rotating the substrate 1 in the exposure step, the irradiation time of the laser beam 2b in the circumferential direction becomes longer than the time of irradiation in the radial direction of the substrate, thereby leading to a thickness difference in the resist layer 2 after the development. In the subsequent etching, a difference in the thickness of the resist layer 2 between the circumferential direction and the radial direction of the substrate 1 imparts anisotropy to the shape of the formed lower portion 3.

Then, a light cure resin, such as an ultraviolet curing resin or the like, is applied on the uneven structure surface of the produced master 4, and a transparent substrate, such as an acryl plate or the like, is put on the resin. Subsequently, ultraviolet light irradiates the light cure resin from the above of the transparent substrate to cure the resin, and then the removes from the master 4. Thus a replica substrate 8 for use in producing an optical device, in which an uneven structure including a light cure resin 7 transferred on a transparent substrate 6 is produced as shown in FIG. 6C.

Next, a conducting film is formed by an electroless plating method on the uneven structure surface of the produced replica substrate 8, and then a metal plating layer is formed by an electrolytic plating method. As a material constituting the electroless plating film and electrolytic plating layer, for example, nickel (Ni) is preferred. After the plating layer is formed, the layer is removed from the replica substrate 8, and subjected to external processing where necessary, to produce a mold 9 for use in producing an optical device shown in FIG. 6D.

Then, the produced mold 9 is set as a mold of an injection molding machine, and the mold is closed to form a cavity, and then a molten resin, such as polycarbonate or the like is filled in to produce, as shown in FIG. 2, the disc-shaped substrate in which the fine arrangement configuration of the structures 12 is integrally formed on the surface of the base 11 (FIG. 6E) is produced. Then, the substrate is cut into a predetermined size to form the optical device 10 having a sub-wavelength structure surface shown in FIG. 1.

It is noted that the master 4 is not limited to a master formed by etching the substrate 1, and the substrate 1 having a pattern of the resist layer 2 formed thereon can be used as a master.

As described above, in the present embodiment, a number of structures 12 arranged on the surface of the base 11 at a fine pitch equal to or shorter than the wavelength of visible light are arrayed such that they form a plurality of arc track rows, and forms the sub-wavelength structure forming a quasi-hexagonal lattice pattern in the adjacent three track rows. Therefore, the packing density of the structures 12 on the surface of the base 11 may be arranged to be high to increase the anti-reflection efficiency of visible light, and obtain the optical device 10 having excellent anti-reflection properties in the wide wavelength range and extremely high transmittance.

Further, in the present embodiment, the master 4 for use in producing an optical device is formed by using the exposure apparatus 5 which is obtained by applying the optical disc recording apparatus. Therefore, not only the optical device 10 having the construction can be produced efficiently in a short time, but also a large-scaled substrate can be handled to improve the productivity.

Second Embodiment

Subsequently, a second embodiment of the present invention is described.

FIG. 7 is diagrammatic process cross-sectional views of a main portion for explaining a method for producing an optical device having the sub-wavelength structures formed on the both surfaces of the base 11. FIG. 7A is a step for forming a pattern of the resist layer 2 on the surface of quartz substrate 1, FIG. 7B is a step for producing the master 4 for use in producing an optical device by performing etching through use of the patterned resist layer 2 as a mask, the master having an uneven structure including the lower portions 3 on the surface of the substrate 1, FIG. 7C is a step for producing a replica substrate 8 for use in forming an optical device in which the uneven structure including the light cure resin 7 is transferred on the transparent substrate 6, FIG. 7D is a step for producing the mold 9 for use in forming an optical device, which is obtained in that a conducting film is grown to plating on the uneven structure surface of the replica substrate 8 and removed from the replica substrate 8.

Figure 7A:
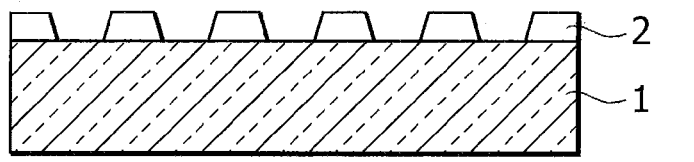
FIG. 7A to 7E are schematic views for explaining the processes of manufacturing an optical device according to a second embodiment of the present invention.
Figure 7B:
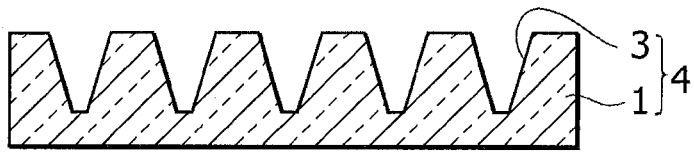
Figure 7C:
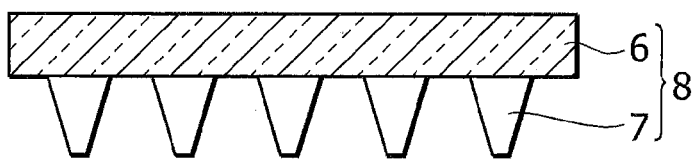
Figure 7D:
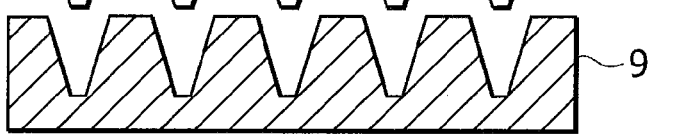
Figure 7E:
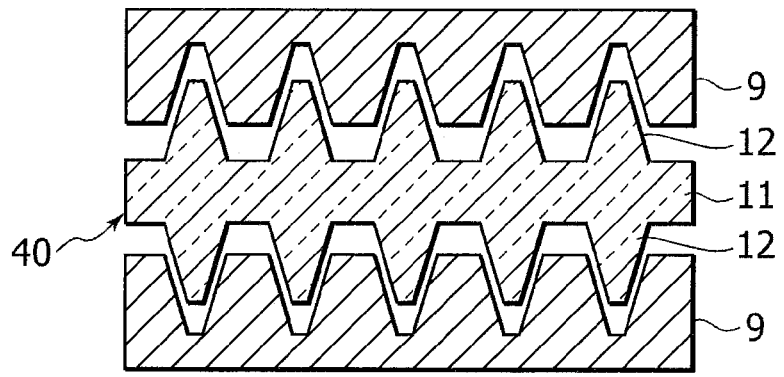

In the present embodiment, two molds 9 produced as above are prepared and these molds 9 are set as a mold for an injection molding machine. In this instance, cavities to be filled with a molten resin are formed in each uneven structure surfaces of the molds 9, and then, as shown in FIG. 7E, a disc-form substrate having fine arrangement structures of the structures 12 integrally formed on the front and rear surfaces is produced. Then, the substrate 11W is cut into a desired shape to produce an optical device 40 having the sub-wavelength structure surfaces on the both surfaces of the base 11.

According to the optical device 40 of the present embodiment, since the sub-wavelength structures are formed on the both surfaces of the base 11, the optical device 40 obtains the anti-light reflection function at the both light entrance surface and light exit surface. This enables to further improve the light transmission characteristics.

When the optical device 40 of the present embodiment is used especially as a light guide member in various light devices, such as a light guide window of a photoelectric conversion apparatus, e.g., as solar cells, a light guide plate, an optical function sheet or film of a liquid crystal display, a light emission window of a illuminating device, it is possible to prevent the front surface reflection and rear surface reflection of light to greatly contribute to the improvement of light utilization efficiency.

Third Embodiment

Figure 8:
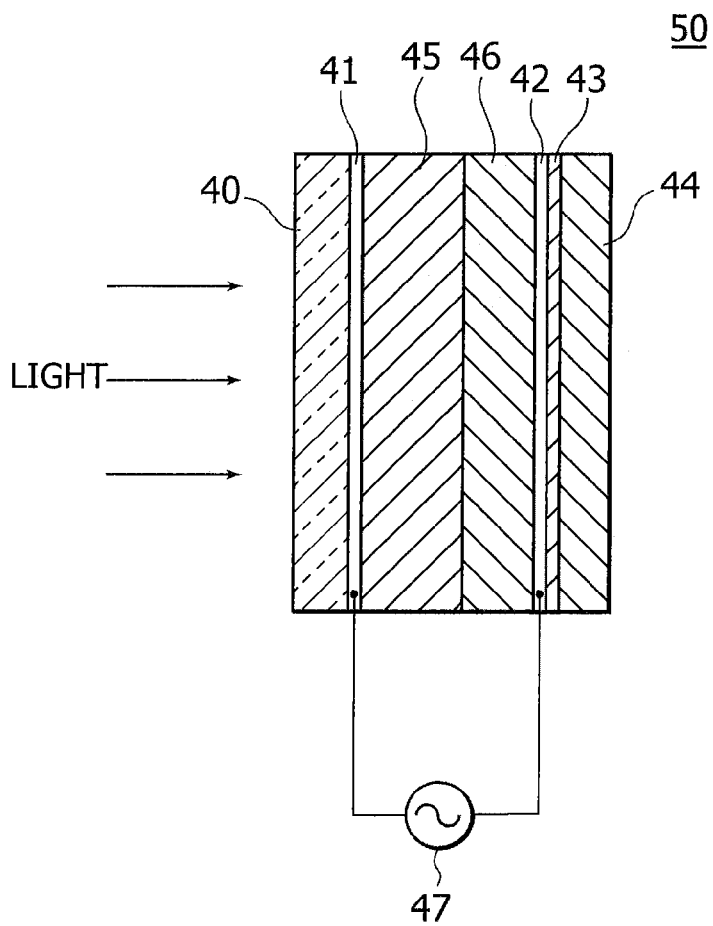
FIG. 8 is a diagrammatic configuration view of a dye-sensitized solar cell served as a photo electric conversion apparatus to be explained in a third embodiment of the present invention.

FIG. 8 shows a third embodiment of the present invention. In the present embodiment, a dye-sensitized solar cell 50 in which the optical device 40 having the construction explained in the second embodiment is used as a light guide window is described as an example.

The dye-sensitized solar cell 50 of the present embodiment includes a light guide window 40 having a transparent conductive film 41 and a laminated body in which a metal-oxide semiconductor layer 45 and an electrolyte layer 46 are provided between the (transparent) conductive film 42 which is opposite to the transparent conductive film 41 and a substrate 44 having a current collection material 43. The semiconductor layer 45 includes, for example, oxide semiconductor materials and sensitizing dyes. Further, the transparent conductive film 41 and the conductive film 42 are connected via a conductor wire to form a current circuit having an ammeter 47.

The light guide window 40 is formed by using a glass substrate or transparent plastic substrate, and the quasi-hexagonal lattice-form fine arrangement structures (sub-wavelength structure) of the structures 12 explained in the first embodiment are provided on a light entrance surface at the outer side (light receiving surface) and a light exit surface at the inner side.

The metal-oxide semiconductor layer 45 constitutes a photoelectric conversion layer formed by sintering metal-oxide particles on the transparent conductive film 41. As materials forming the metal-oxide semiconductor layer 45, for example, include metal oxides, such as $TiO_2$, MgO, ZnO, $SnO_2$, $WO_3$, $Nb_2O_5$, $TiSrO_3$. Further, sensitizing dyes are supported on the metal-oxide semiconductor layer 45 and the metal oxide semiconductor is sensitized by the sensitizing dyes. Sensitizing dyes are not particularly restricted, and any sensitizing dye capable of causing sensitization can be used, for example, bipyridine, phenanthroline derivative, xanthene type dye, cyanine type dye, basic dye, porphyrin type compound, azo dye, phthalocyanine compound, anthraquinone type dye, and polycyclic quinine type dye.

The electrolyte layer 46 includes at least one kind of material system (oxidation-reduction type) causing the reversible change of state in oxidation/reduction is dissolved in electrolyte. The electrolyte may be a liquid electrolyte or a gel electrolyte having the material system contained in high-molecular materials, high-molecular solid materials, or inorganic solid electrolytes. As an oxidation-reduction type, for example, halogens such as $I^-/I^{3-}$ and $Br^-/Br^2$, quinone/hydroquinone, pseudo-halogens such as $SCN^-/(SCN)_2$, iron(II) ion/iron(III) ion, copper(I) ion/copper(II) ion can be used, but not limited to them. As a solvent, an ordinary temperature molten salt, such as nitrile types such as acetonitrile, propylene carbonate, carbonate types such as ethylene carbonate, gamma-butyrolactone, pyridine, dimethylacetamide, other polar solvents, methylpropylimidazolium-iodine, or mixtures thereof can be used.

In the dye-sensitized solar cell 50 having the construction, light received by the light receiving surface of the light guide window 40 excites the sensitizing dyes supported on the surface of the metal-oxide semiconductor layer 45, and the sensitizing dyes quickly pass electrons to the metal-oxide semiconductor layer 45. On the other hand, the sensitizing dyes which lost electrons receive electrons from ions of the electrolyte layer 46 which is a carrier moving layer. Molecules which passed electrons receive electrons from the opposite electrode 42. As described above, current flows between the electrodes 41 and 42.

According to the present embodiment, since the light receiving surface of the dye-sensitized solar cell 50 is constructed with the light guide window 40 which is an optical device according to the present invention, the front surface reflection of light received by the light receiving surface (light entrance surface) and the reflection of transmitted light at the rear surface (light exit surface) of the light guide window 40 can effectively be prevented. This enables to increase the light utilization efficiency of the received light, and improve the photoelectric conversion efficiency, that is, the power generation efficiency.

Further, since the light entrance surface and light exit surface of the light guide window 40 have the sub-wavelength structures in which the structures 12 (FIG. 1) are finely arranged at a pitch shorter than the wavelength of visible light, the photoelectric conversion efficiency of a photoelectric converter having a sensitivity in a range from a near-ultraviolet region to a visible light range and a near-infrared region can be effectively increased.

Forth Embodiment

Figure 9:
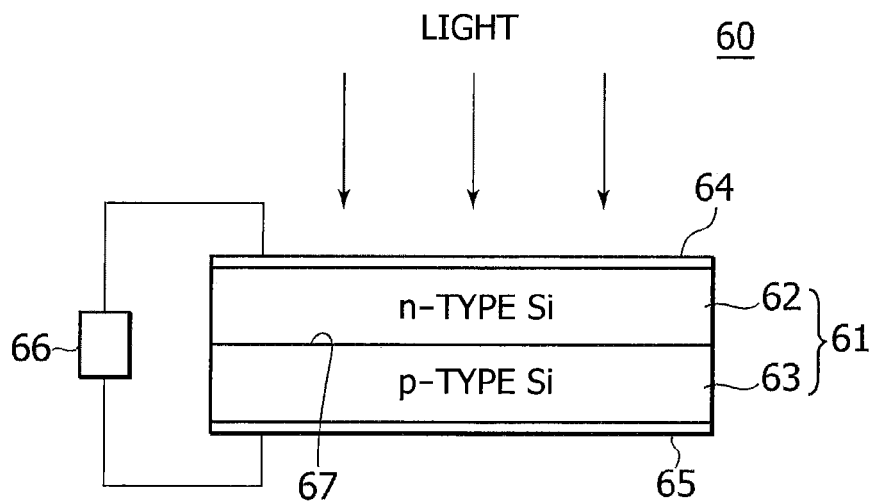
FIG. 9 is a diagrammatic configuration view of a silicon solar cell served as a photoelectric conversion apparatus to be explained in a forth embodiment of the present invention.

FIG. 9 shows a forth embodiment of the present invention. In the present embodiment, an example in which the present invention is applied to a silicon solar cell 60 is described as a photoelectric conversion apparatus.

FIG. 9 shows a diagrammatic view showing the construction of the silicon solar cell 60. The silicon solar cell 60 includes a silicon substrate 61, transparent conductive films 64, 65 formed on the front and rear surfaces of the silicon substrate 61, a load 66 connected between the transparent conductive films 64 and 65. The silicon substrate 61 includes a junction type Si substrate having an n-type semiconductor layer 62 and a p-type semiconductor layer 63, and at a pn junction 67 between the n-type semiconductor layer 62 and the p-type semiconductor layer 63, a photoelectric conversion layer that generates electricity in accordance with an amount of incident light entering the n-type semiconductor layer 62 is formed.

In the present embodiment, the surface of the n-type semiconductor layer 62 constituting a light receiving surface is a sub-wavelength structure surface in which the structures 12 (FIG. 1) are arranged at a fine pitch equal to or shorter than the wavelength of incident light in a quasi-hexagonal lattice form, and the reflection of light at the entrance surface of the n-type semiconductor layer 62 is prevented, and thereby improving the transmission characteristics. This enables to increase the photoelectric conversion efficiency at the pn junction 67.

Further, by forming the fine arrangement structure of the structures 12 (FIG. 1) formed on the light entrance surface of the silicon substrate 61 at a fine pitch equal to or shorter than the wavelength of near-ultraviolet light, it is possible for a silicon solar cell having the sensitivity in a wide range from the near-ultraviolet region to the near-infrared region to dramatically improve the photoelectric conversion efficiency.

The silicon solar cell 60 having the above construction can be produced by directly etching the surface of the silicon substrate 61 constituting the n-type semiconductor layer 62. FIG. 10 is process cross-sectional view of a main portion for explaining a method for producing this silicon solar cell.

First, as shown in FIG. 10A, a resist layer 70 is formed on the surface of the silicon substrate 61, the exposure technology and development process in which the optical disc recording technique explained in the first embodiment is applied, are performed to form a mask pattern of the resist layer 70 on the surface of the silicon substrate 61. Then, the formed mask pattern of the resist layer 70 is used as a mask to perform the etching process to an etching gas by using a fluorocarbon gas, such as $CF_4$, and as shown in FIG. 10B, an uneven pattern having cone-shape lower portions 71 on the surface of the silicon substrate 61 is formed. The silicon substrate 61 having the sub-wavelength structure surface is thus produced.

Hereinafter, examples of the present invention are described, but the present invention is not limited to the following examples.

Example 1

Preparation of Master

A chemically amplifying type or novolak positive type resist layer was applied on a quartz substrate with the thickness of about 150 nm, and a latent image of quasi-hexagonal lattice pattern was formed on the resist layer by using the exposure apparatus 5 shown in FIG. 5. The wavelength of the laser beam was 266 nm, and the laser power was 0.50 mJ/m. Then, the resist layer was subject to development process to form a resist pattern. As a developer, an inorganic alkaline developer (manufactured and sold by TOKYO OHKA KOGYO CO., LTD.) was used.

Next, a process for removing the resist pattern by O2 ashing and increasing the opening diameter and a process for subjecting the quartz substrate to plasma etching in an atmosphere of $CHF_3$ gas ware conducted repeatedly. As a result, the exposed surface of the quartz substrate was etched as the quasi-hexagonal lattice pattern diameter was gradually increased, and the other region was not etched because of the resist pattern being used as a mask, thus lower portions 3 of a substantially triangular cross-section shape schematically shown in FIG. 6B was formed. The etching amount was varied by changing the etching time. Finally, the resist pattern was completely removed by O2 ashing.

In the manner described above, a sub-wavelength structure master (master) having lower portions of a quasi-hexagonal lattice pattern having a pitch P1 of 330 nm in the circumferential direction, a pitch P2 of 300 nm in the direction at about 60° to the circumferential direction (about −60° direction), and a depth of about 250 to 450 nm was prepared.

[Production of Replica Substrate]

Next, an ultraviolet curing resin was applied on the formed sub-wavelength structure master, and then an acryl plate was adhered on the ultraviolet curing resin. Then, the acryl plate was irradiated with ultraviolet light to cure the ultraviolet curing resin, and the resultant resin was removed from the quartz master. In the manner described above, a sub-wavelength structure ultraviolet-cured replica substrate having higher portions of a quasi-hexagonal lattice pattern was produced.

[Production of Molding Die]

Next, a conducting film including a nickel film was formed by an electroless plating method on the uneven pattern of the formed sub-wavelength structure ultraviolet-cured replica substrate. Then, the replica substrate having the conducting film layer formed thereon was placed in an electroforming machine, and a nickel plating layer having a thickness of about 300±5 μm was formed on the conducting film by an electroplating method. Subsequently, the nickel plating layer was removed from the replica substrate by using a cutter or the like, and then the transferred uneven structure surface was washed with acetone, thus to produce a sub-wavelength structure Ni metal master (molding die) having lower portions of a quasi-hexagonal lattice pattern.

[Production of Optical Device]

Next, an injection molded substrate formed of a polycarbonate resin was produced by using the formed sub-wavelength structure Ni metal master to obtain a sub-wavelength structure molding replica substrate having higher portions of a quasi-hexagonal lattice pattern on the surface. Then, the replica substrate obtained was cut into a predetermined size to produce an optical device according to the present invention.

Example 2

In the present example, the $CHF_3$ gas plasma etching time in the step for producing a master was changed to produce sub-wavelength structure quartz masters A, B each having a quasi-hexagonal lattice pattern in which the spatial frequency {circumferential period (arrangement pitch P1): 330 nm; circumferential 60° period (arrangement pitch P2): 300 nm} is uniform. In addition, a sub-wavelength structure quartz master D having a quasi-hexagonal lattice pattern in which the spatial frequency (P1: 350 nm; pitch P2: 300 nm) is uniform was produced.

Then, ultraviolet-cured replica substrates A1 for the sub-wavelength structure quartz masters A, an ultraviolet-cured replica sheet B1 for the sub-wavelength structure quartz master, and molding replica substrates (polycarbonate; refractive index: 1.59) A2, D2 for the sub-wavelength structure quartz masters A, D were respectively produced. The etching times for the quartz masters A, B, D and the form of the uneven structures of the ultraviolet-cured replica substrates (sheet) A1, B1 and molding replica substrates A2, D2 are shown in FIG. 11. It is noted that a pattern height of each samples was measured from cross-sectional profiles obtained from an AFM (Atomic Force Microscope).

In FIG. 11, the height (depth) of the structure in the circumferential direction was smaller than the height (depth) in the radial direction, and, in addition, the height (depth) of the portion other than the sub-wavelength structure in the circumferential direction was substantially same with the height (depth) in the radial direction, and therefore the depth of the sub-wavelength structure was represented by the height (depth) in the radial direction.

Further, the aspect ratio and the average arrangement pitch in FIG. 11 are defined by the following expressions (1) and (2).

$$\text{The aspect ratio} = H/P \tag{1}$$

where H: the height of the structure in the circumferential direction, and P: the average arrangement pitch (average period).

$$\text{The average arrangement pitch } P=(P1+P2+P2)/3=(330+300+300)/3=310 \quad (2)$$

where P1: the arrangement pitch in the circumferential direction (circumferential period), and P2: the arrangement pitch in a ±θ direction to the circumferential direction (where θ=60°−δ).

It is noted that the aspect ratio and the arrangement pit are similarly defined also in the following examples.

Figure 12:
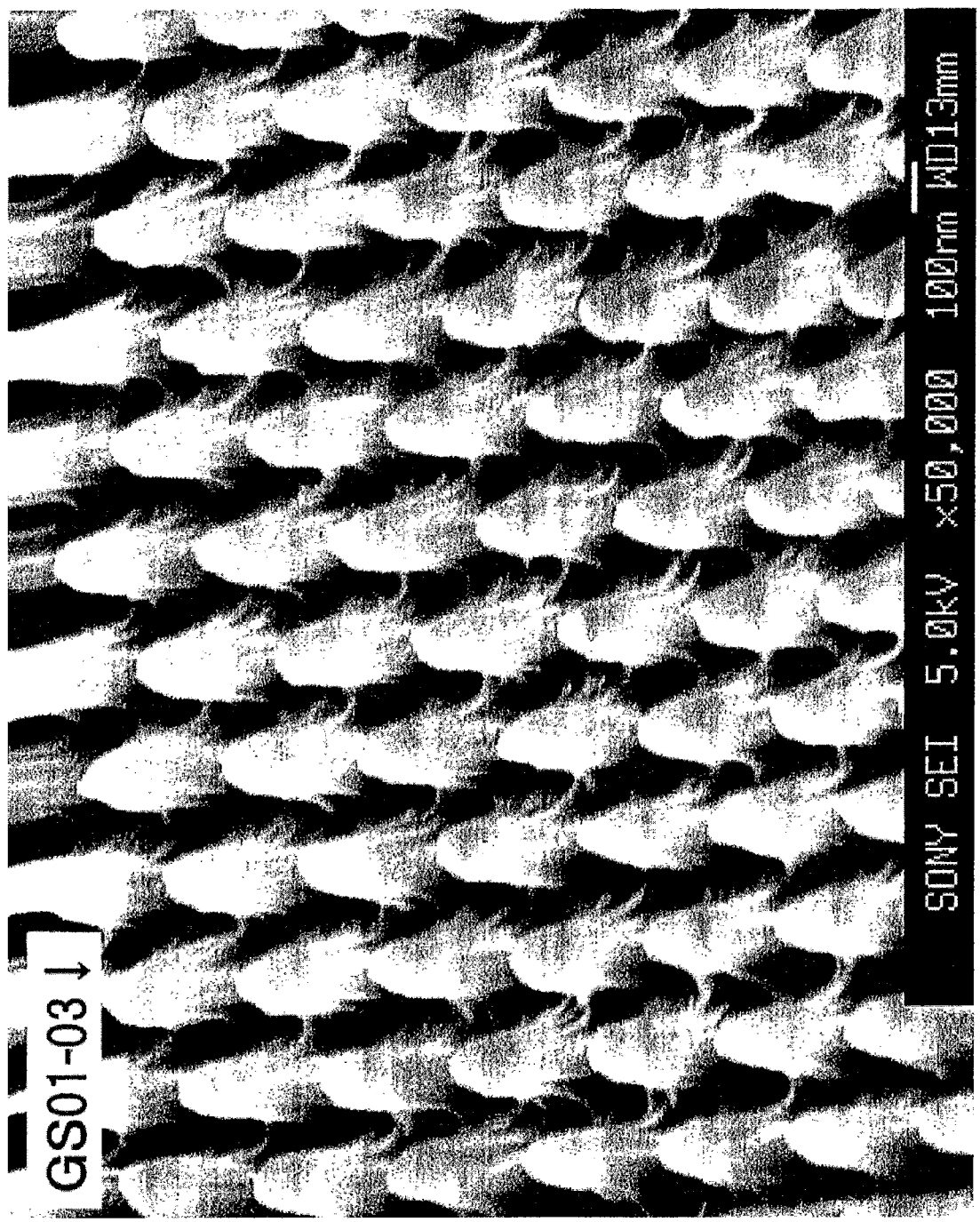
FIG. 12 is a diagram showing a SEM photograph of the sample prepared in one example of the present invention.

FIG. 12 is a SEM photograph of the ultraviolet-cured replica substrate A1. The sub-wavelength structure shape shown in FIG. 12 is an elliptical cone shape having a slope at the middle portion which is steeper than the slopes at the top portion and bottom portion. Further, the sub-wavelength structures are arrayed in a quasi-hexagonal lattice pattern. The structure having such a shape can be obtained by employing an etching step for the quartz master A in which the etching time from the top portion to middle portion of the structure is arranged to be long and the etching time from the middle portion to bottom portion of the structure is arranged to become gradually short. Specifically, processings shown below were sequentially conducted. It is noted that the same method was used for the other quartz masters B and D, except to adjust the etching time or the number of cycles appropriately in accordance with the shapes of them.

1. O2 Ashing for 5 seconds, $CHF_3$ etching for 1 minute
2. O2 Ashing for 5 seconds, $CHF_3$ etching for 2 minutes
3. O2 Ashing for 5 seconds, $CHF_3$ etching for 3 minutes
4. O2 Ashing for 5 seconds, $CHF_3$ etching for 4 minutes
5. O2 Ashing for 5 seconds, $CHF_3$ etching for 3 minutes
6. O2 Ashing for 5 seconds, $CHF_3$ etching for 2 minutes
7. O2 Ashing for 5 seconds, $CHF_3$ etching for 1 minute
8. O2 Ashing for 15 seconds It is noted that the height of the pattern in the circumferential direction was smaller than the height in the radial direction. In addition, the height of the portion other than the pattern in the circumferential direction was substantially the same with the height in the radial direction, and therefore the height in the radial direction was representatively used as a pattern height.

(Evaluation of the Reflectance)

With respect to each sample, the reflectance was evaluated by using a machine ("V-500", manufactured and sold by JASCO Corporation). Wavelength properties of the reflectance with respect to each sample are shown in FIGS. 13A, 13B, 14A and 14B.

Figure 13A:
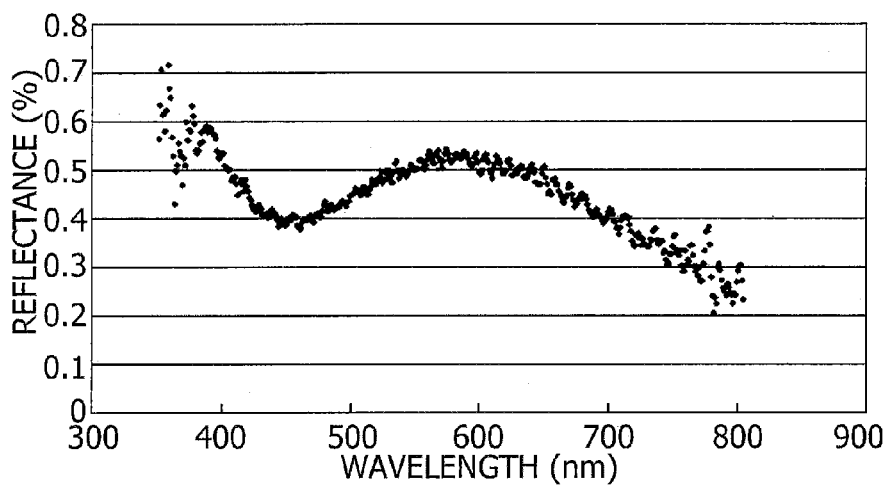
FIG. 13 is a diagram showing the wavelength dependency characteristics of the reflectance with respect to the samples prepared in one example of the present invention.

FIG. 13A shows the reflectance property of the sample A1. The reflectance of the sample A1 has wavelength dependency, but it has an average reflectance small enough as 0.45% in the visible light range (400 to 780 nm).

Figure 13B:
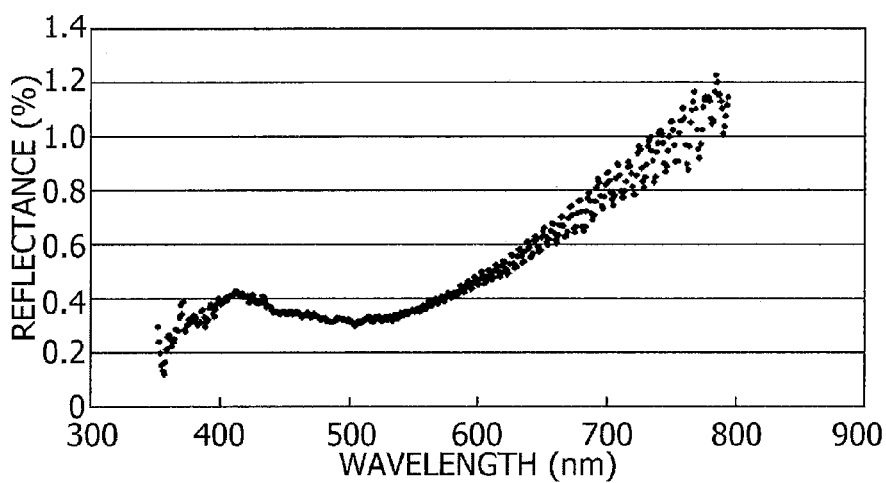

FIG. 13B shows the reflectance of the sample B1. The sample B1 also has wavelength dependency of the reflectance, and has an increased reflectance on the longer wavelength side, but it has satisfactory properties such as the reflectance less than 1% in the visible light range of 780 nm or less, and the reflectance less than 0.6% in the wavelength range for display (R: 650 nm; G: 530 nm; B: 440 nm).

Figure 14A:
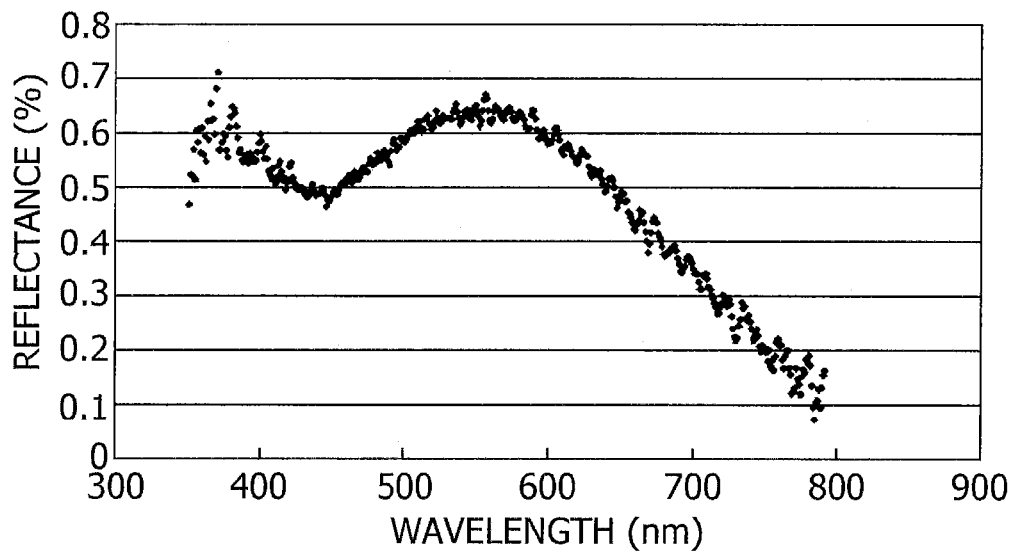
FIG. 14 is a diagram showing the wavelength dependency characteristics of the reflectance with respect to the samples prepared in one example of the present invention.

FIG. 14A shows the reflectance characteristic of the sample A2. The sample A2 has the wavelength dependency and reflectance same with those of the sample A1. The results have confirmed that the sample A1 and sample A2 have similar transfer performance for the uneven structure surface.

Figure 14B:
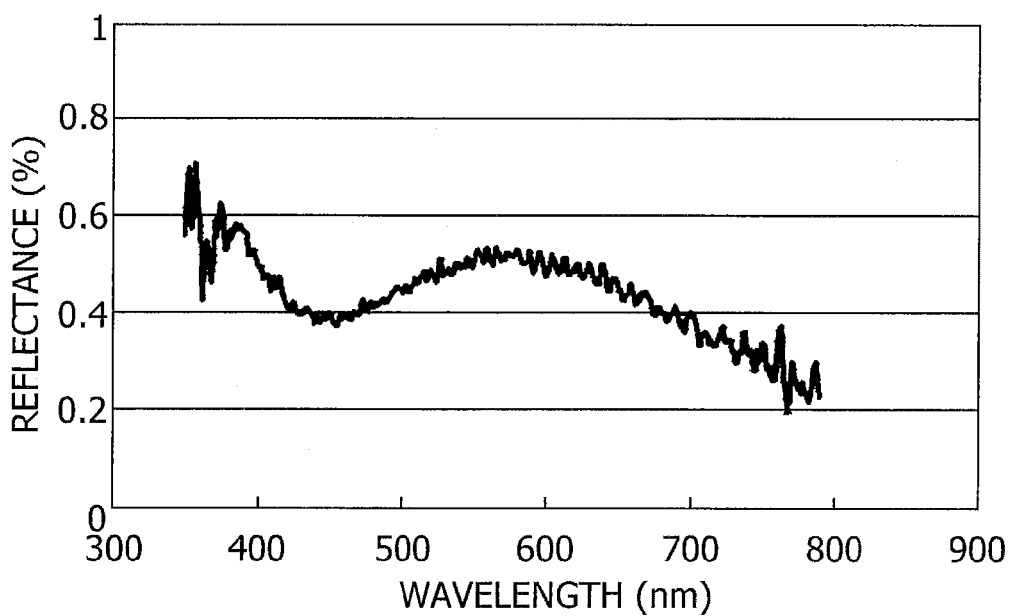

FIG. 14B shows the reflectance of the sample D2. The sample D2 has wavelength dependency of the reflectance, but it has an average reflectance small enough as 0.40% in the visible light range. The results have confirmed that the quasi-hexagonal lattice pattern in which a spatial frequency is P1: 350 nm and P2: 300 nm can achieve excellent anti-reflection properties.

As apparent from the above results, when the spatial frequency is P1: 330 to 350 nm, P2: 300 nm, satisfactory antireflection properties can be obtained. In other words, in the replica substrate having a value of P1/P2 being 1.1 to 1.17, satisfactory anti-reflection properties can be obtained.

Further, when the moth eye structure has a high, elliptical cone shape in a distorted hexagonal lattice pattern and has a pattern height distribution in which the aspect ratio is 1.25 to 1.46, very excellent anti-reflection properties can be obtained.

Example 3

In the present example, the $CHF_3$ gas plasma etching time in the step for producing a master was set to be a certain to produce a sub-wavelength structure quartz master C having a quasi-hexagonal lattice pattern in which the spatial frequency {circumferential period (arrangement pitch P1): 330 nm; circumferential 60° period (arrangement pitch P2): 300 nm} is uniform. It is noted that lower portions of the sub-wavelength structure quartz master C have the depth distribution.

Then, an ultraviolet-cured replica substrates C1 for the sub-wavelength structure quartz master C was produced. The etching time for the quartz master C and the form of the uneven structure of the ultraviolet-cured replica substrate C1 are shown in FIG. 11. It is noted that the pattern height of each samples was measured from cross-sectional profiles of an AFM (Atomic Force Microscope).

In FIG. 11, the height (depth) of the structure in the circumferential direction was smaller than the height (depth) in the radial direction, and, in addition, the height (depth) of the portion other than the sub-wavelength structure in the circumferential direction was substantially same with the height (depth) in the radial direction, and therefore the depth of the sub-wavelength structure was represented by the height (depth) in the radial direction.

Further, the aspect ratio and the average arrangement pitch in FIG. 11 are defined by the expressions (1) and (2).

Figure 15:
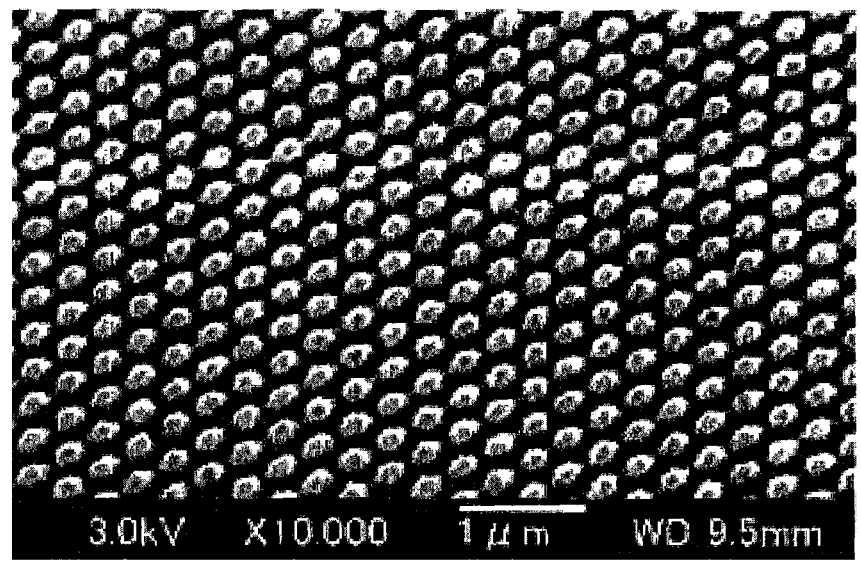
FIG. 15 is a diagram showing a SEM photograph of a main surface of a replica substrate prepared in a third example of the present invention.
Figure 16:
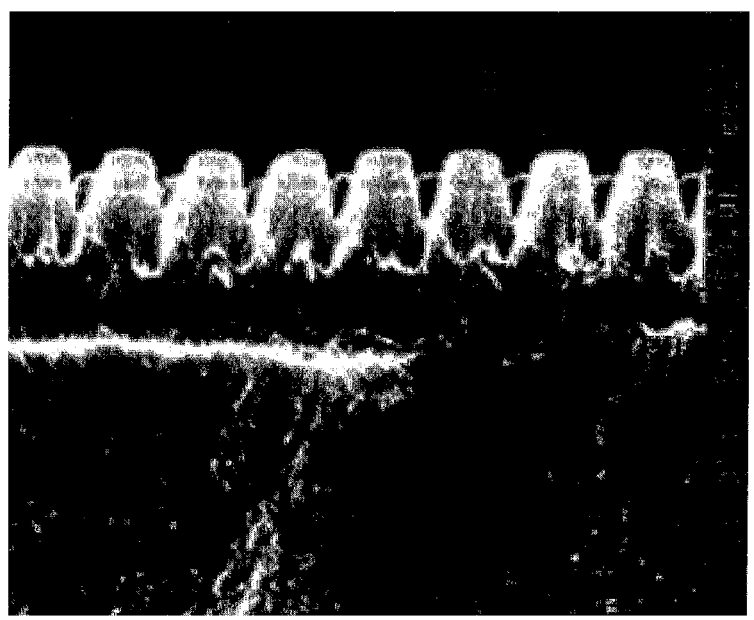
FIG. 16 is a diagram showing a SEM photograph of a cross section of the replica substrate prepared in a third example of the present invention.

FIGS. 15 and 16 are SEM photographs of the ultraviolet-cured replica substrate C. The structures are arranged in a quasi-hexagonal lattice pattern as shown in FIG. 15. Further, the structure has an elliptical cone shape. The structure having such a shape can be obtained by providing an opening in a resist mask and employing the etching step for the quartz master C to have certain ashing time and the etching time. Specifically, the processings shown below were sequentially conducted.

1. O2 Ashing for 5 seconds, CHF3 etching for 2.5 minutes
2. O2 Ashing for 5 seconds, CHF3 etching for 2.5 minutes
3. O2 Ashing for 5 seconds, CHF3 etching for 2.5 minutes
4. O2 Ashing for 5 seconds, CHF3 etching for 2.5 minutes
5. O2 Ashing for 5 seconds, CHF3 etching for 2.5 minutes
6. O2 Ashing for 5 seconds, CHF3 etching for 2.5 minutes 7. O2 Ashing for 5 seconds, CHF3 etching for 2.5 minutes 8. O2 Ashing for 5 seconds, CHF3 etching for 2.5 minutes 9. O2 Ashing for 15 seconds (Evaluation of Reflectance)

With respect to each sample, the reflectance was evaluated using a machine ("V-500", manufactured and sold by JASCO Corporation). The results are shown in FIG. 13C.

Figure 13C:
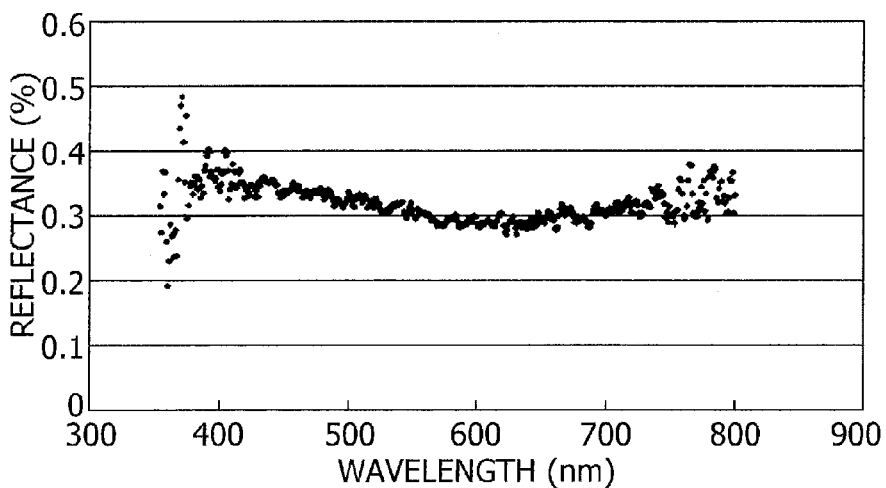

FIG. 13C shows the reflectance property of the sample C1. The sample C1 has the stable reflectance property even on the longer wavelength side, little wavelength dependency, and very low reflectance. The sample exhibits very excellent anti-reflection properties such as the reflectance less than 0.35% in the visible light range and the average reflectance of 0.3%. The wavelength dependency is low due to the facts that the uneven structured hexagonal lattice pattern is distorted and the height distribution (depth distribution) of the uneven structure are large.

Further, as the reason of low reflectance, it is presumed that since the elliptical cone shape has the wide width, the packing density can be increased.

The structures in the example 2 and in the example 3 are compared, and when the structures in the example 2 and in the example 3 are viewed from the above of the substrate, the structures in the example 2 are seen as small thin circles, whereas the structures in the example 3 are viewed as large circles. In other words, the structures in the example 3 seem to have larger volumes as compared with the structures in the example 2. Accordingly, the packing density of the structures in the example 3 may be arranged to be higher than the packing density of the structures in the example 2.

Example 4

Production of Master

A chemically amplifying type or novolak positive type resist layer was applied on a quartz substrate at the thickness about 150 nm, and a latent image of quasi-hexagonal lattice pattern was formed in the resist layer by using the exposure apparatus 5 shown in FIG. 5. The wavelength of the laser beam was 266 nm, and the laser power was 0.50 mJ/m. Then, the resist layer was subject to development processing to form a resist pattern. As a developer, an inorganic alkaline developer (manufactured and sold by TOKYO OHKA KOGYO CO., LTD.) was used.

Next, a process for removing the resist pattern by $O_2$ ashing (5 seconds) and increasing the opening diameter and a process for subjecting the quartz substrate to plasma etching (3 minutes) in an atmosphere of $CHF_3$ gas were conducted repeatedly. As a result, the exposed surface of the quartz substrate was etched as the quasi-hexagonal lattice pattern diameter was gradually increased, and the other region was not etched because of the resist pattern was used as a mask, thus lower portions 3 of a substantially triangular cross-section shape schematically shown in FIG. 6B was formed. The etching amount was changed in accordance with the etching time. Finally, the resist pattern was completely removed by $O_2$ ashing.

In the manner described above, a sub-wavelength structure master (master) having lower portions of a quasi-hexagonal lattice pattern having a pitch P1 of 330 nm in the circumferential direction, a pitch P2 of 300 nm in the direction at about 60° to the circumferential direction (about −60° direction), and a depth of about 270 to 400 nm was prepared.

[Production of Replica Substrate]

Next, an ultraviolet curing resin was applied on the formed sub-wavelength structure master, and then an acryl plate was adhered on the ultraviolet curing resin. Then, the ultraviolet curing resin was cured by irradiating ultraviolet light, and removed from the quartz master. In the manner described above, a sub-wavelength structure ultraviolet-cured replica substrate having higher portions of a quasi-hexagonal lattice pattern was produced.

[Production of Molding Die]

Next, a conducting film including a nickel film was formed by an electroless plating method on the uneven pattern of the formed sub-wavelength structure ultraviolet-cured replica substrate. Then, the replica substrate having the conducting film layer formed thereon was placed in an electroforming apparatus, and a nickel plating layer having a thickness of about 300±5 μm was formed on the conductive film by an electroplating method. Subsequently, the nickel plating layer was removed from the replica substrate by using a cutter or the like, and then the transferred uneven structure surface was washed with acetone to produce a sub-wavelength structure Ni metal master (molding die) having lower portions of a quasi-hexagonal lattice pattern.

[Production of Optical Device]

Next, an injection molded substrate formed of a polycarbonate resin was prepared by using the formed sub-wavelength structure Ni metal master to obtain a sub-wavelength structure molding replica substrate having higher portions of a quasi-hexagonal lattice pattern on the surface. Then, the replica substrate was cut into a predetermined size to produce an optical device according to the present invention.

Example 5

In the present example, the $CHF_3$ gas plasma etching time in the step for producing a master was changed to produce sub-wavelength structure quartz masters A, E, each having a quasi-hexagonal lattice pattern in which the spatial frequency {circumferential period (arrangement pitch P1): 330 nm; circumferential 60° period (arrangement pitch P2): 300 nm} is uniform. In addition, a sub-wavelength structure quartz master F having a quasi-hexagonal lattice pattern in which the spatial frequency (P1: 315 nm; pitch P2: 275 nm) is uniform was produced.

Then, ultraviolet-cured replica substrates A1,E1, F1 for the sub-wavelength structure quartz masters A, E, F, and a molding replica substrate (polycarbonate; refractive index: 1.59) A2 for the sub-wavelength structure quartz master A were respectively produced. Further, ultraviolet curing replica substrates (the replica substrate having an uneven structure including the ultraviolet cure resin 7 transferred on the both surfaces of the transparent substrate 6 in FIG. 6C) EW1, FW1 were respectively produced. At both sides of the ultraviolet curing replica substrate, sub-wavelength structures are provided. The etching times for the quartz masters A, E, F and the uneven structures of the ultraviolet-cured replica substrates A1, E1, F1 and molding replica substrates A2 are collectively shown in FIG. 17.

A pattern height of each sample was measured from cross-sectional profiles obtained from an AFM (Atomic Force Microscope). It is noted that the height of the pattern in the circumferential direction was smaller than the height in the radial direction. In addition, the height of the portion other than the pattern in the circumferential direction was substantially same with the height in the radial direction, and therefore the height of the pattern was represented by the height in the radial direction.

(Evaluation of Transmittance)

Figure 19:
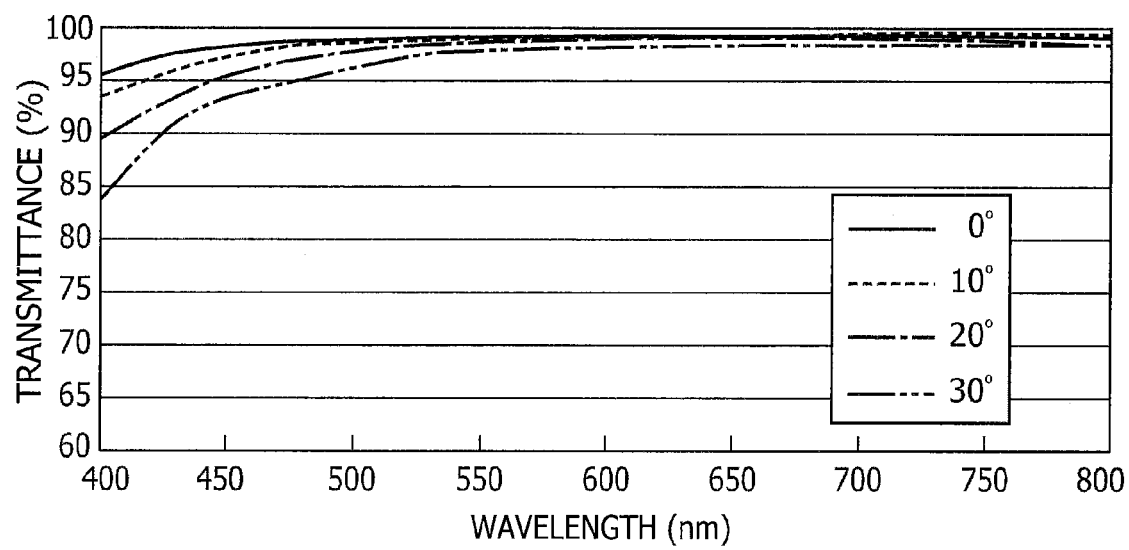
FIG. 19 is a graph showing the wavelength dependency characteristics of the transmittance with respect to a sample E1 prepared in the fifth example of the present invention.
Figure 20:
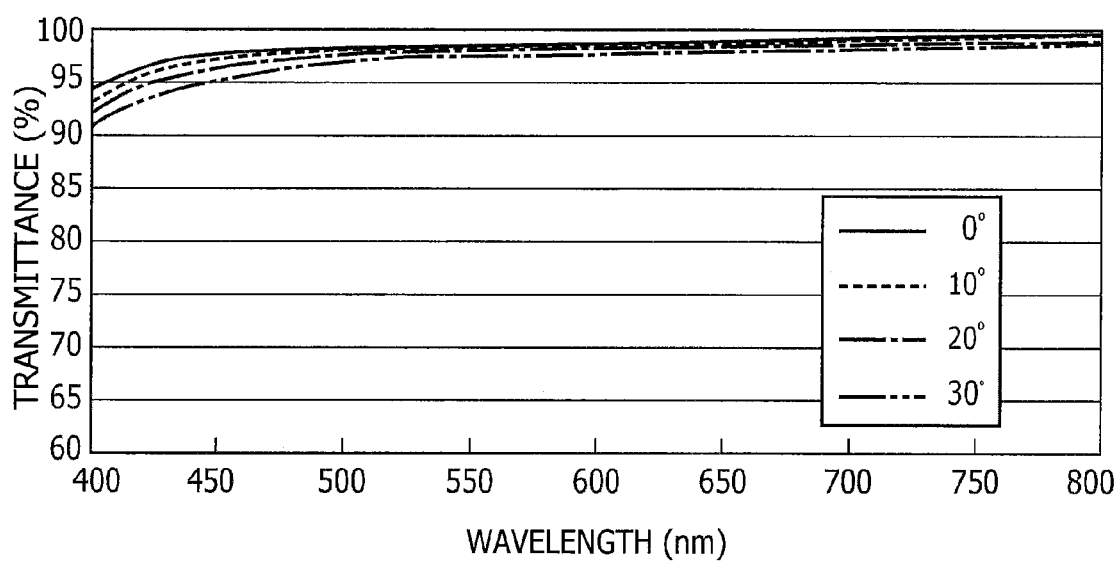
FIG. 20 is a graph showing the wavelength dependency characteristics of the transmittance with respect to a sample FW1 prepared in the fifth example of the present invention.

With respect to each sample, the transmittance was evaluated by using a measuring machine "V-500", manufactured and sold by JASCO Corporation. Wavelength properties of the transmittance with respect to each sample are shown in FIG. 18 to 20.

Figure 18A:
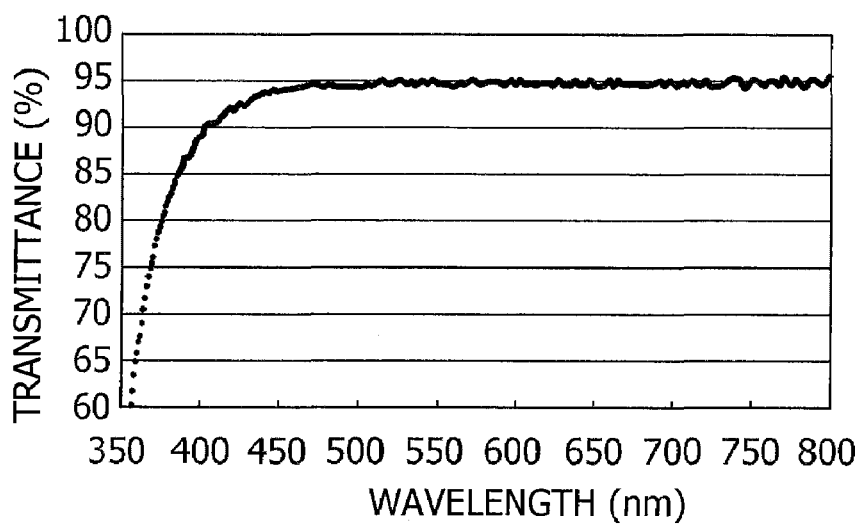
FIG. 18 is a diagram showing the wavelength dependency characteristics of the reflectance with respect to the samples A1, A2 and E1 prepared in the fifth example of the present invention.

FIG. 18A shows the transmission characteristics of the sample A1. The sample A1 has little wavelength dependency in the transmittance and the average transmittance is 95 to 96% in wavelengths (440 nm to 800 nm), and therefore has satisfactory properties.

Figure 18B:
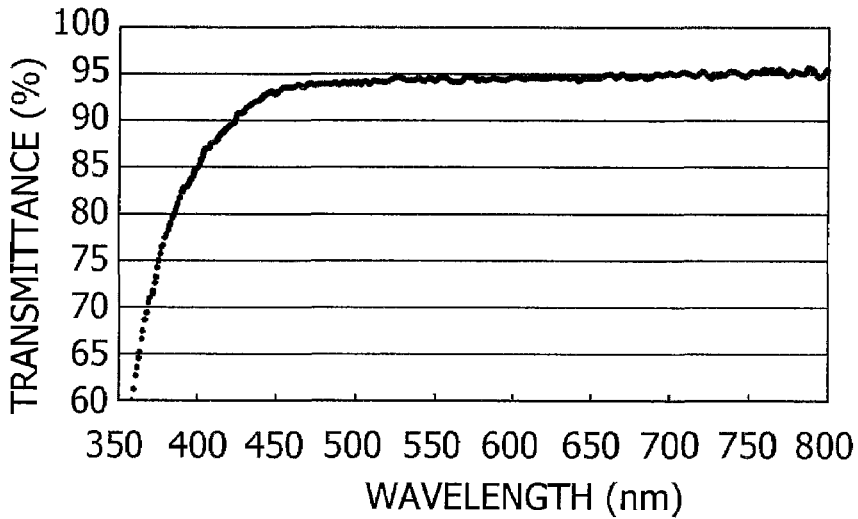

FIG. 18B shows the transmission characteristics of the sample A2. In the sample A2, the transmission characteristics in the wavelengths of 450 nm or less are not so excellent, but the average transmittance is 95 to 96% in wavelength ranges for a display (R: 650 nm; G: 530 nm; B: 450 nm), and therefore has satisfactory properties. Further, the sample A2 has wavelength dependency and transmittance similar with those of the ultraviolet cured replica substrate sample A1. The results have confirmed that the sample A1 and sample A2 have similar transfer performance for the uneven structure surface.

Figure 18C:
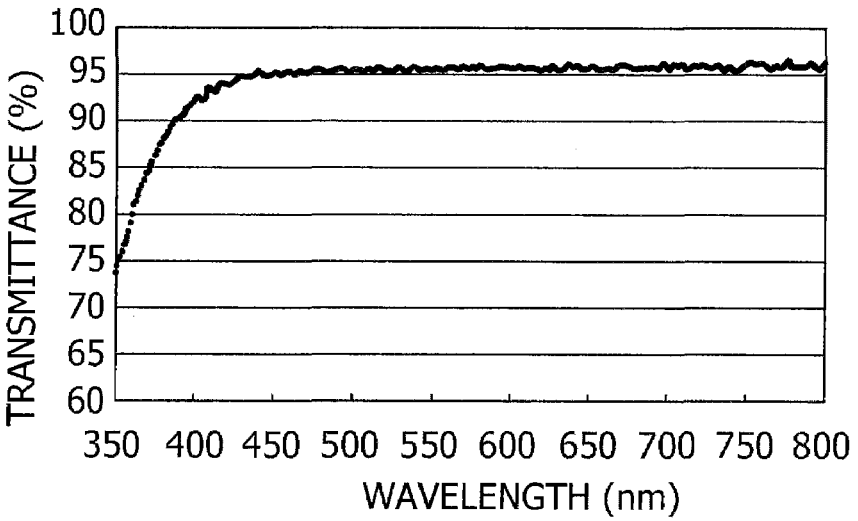

FIG. 18C shows the transmission characteristics of the sample E1. The sample E1 has little wavelength dependency and has very high and stable transmittance. The sample exhibits the average transmittance of 95 to 96% even in the wavelength (430 to 800 nm) and very excellent transmittance characteristic.

FIG. 19 shows the transmission characteristics and light incident angle dependency characteristic of the sample EW1. The transmission characteristics of the ultraviolet curing replica substrate sample EW1 having the subwavelength structure on the both surfaces thereof is further improved, as compared with that of the sample E1, because there is no reflection at the rear surface. The average transmittance is 99% at the incident angle of 0° in the wavelength range of 430 to 800 nm, therefore very satisfactory property can be obtained. Further, even if the incident angle is increased, the satisfactory property such as the transmittance of 96% at the incident angle of 20° and the transmittance of 93.5% at the incident angle of 30° in a blue wavelength (450 nm).

In Japanese Patent Application Publication No. JP 2006-145885 (patent document 1), an example is shown in which the transmittances of a red LED light (640 nm), a green LED light (530 nm) and a blue LED light (450 nm) are improved to 80%, 80% and 50%, respectively, by using a laminated structure of dielectric thin films, however, in the examples of the present invention, the transmittances are 99%, 99% and 99%, respectively, and thus, the transmittances are improved prominently. The incident angle dependencies are also low and sufficient transmission characteristics are obtained in the angle of ±20° to 30°.

In particular, the transmission characteristics of blue light (450 nm) is improved from 50% to 99%, which shows twice higher performance. This means that devices are less likely to be deteriorated due to absorption of the blue light. Accordingly, it is possible to provide an highly reliable optical filter device or a LED display using this optical filter device. In addition, since rare earths, such as niobium (Nb), are not used, it is possible to provide an optical filter device free from environmental pollution problems or an LED display using this optical filter device.

Next, FIG. 20 shows the transmission characteristics and incident angle dependencies of the sample FW1. The transmission characteristics of the ultraviolet curing the replica substrate sample FW1 having the sub-wavelength structures on the both surfaces thereof has little wavelength dependency and the average transmittance is 98% in the visible light range (400 to 800 nm) to realize significantly excellent transmission characteristics. The significantly excellent transmission characteristics are also confirmed in a quasi-hexagonal lattice pattern having the spatial frequency (P1: 315 nm; pitch P2: 275 nm). Accordingly, in addition to an LED display, the optical device can be applied to many products, such as fluorescent lamp displays, and light guide devices of illuminating devices.

From the above results, the sufficient transmission characteristics can be obtained in the spatial frequency of P1: 315 to 330 nm and P2: 275 to 300 nm. In the other words, the sufficient transmission characteristics can be obtained in a replica substrate having a value of P1/P2 as 1.05 to 1.2.

Further, when the sub-wavelength structure has a high, elliptical cone shape in a distorted hexagonal lattice pattern and a pattern height distribution in which the aspect ratio is 0.94 to 1.28, very excellent transmission characteristics can be obtained.

Example 6

In the present example, the $CHF_3$ gas plasma etching time in the step for producing a master was changed to produce a sub-wavelength structure quartz master F having a quasi-hexagonal lattice pattern in which the spatial frequency {circumferential period (arrangement pitch P1): 315 nm; circumferential 60° period (arrangement pitch P2): 275 nm} is uniform. In addition, a sub-wavelength structure quartz master G having a quasi-hexagonal lattice pattern in which the spatial frequency (P1: 300 nm; pitch P2: 265 nm) is uniform was produced.

Then, an ultraviolet-cured replica substrate F1 for the sub-wavelength structure quartz master F, and a molding replica substrate (polycarbonate; refractive index: 1.59) G1 for the sub-wavelength structure quartz masters G were respectively produced. Further, ultraviolet curing replica substrates having sub-wavelength structures at both sides (the replica substrate having an uneven structure including an ultraviolet cure resin 7 transferred on the both surfaces of the transparent substrate 6 in FIG. 6C) FW1, GW1 were respectively produced. The etching times for the quartz masters F, G and the uneven structures of the ultraviolet-cured replica substrate F1 and the molding replica substrate G1 are shown in FIG. 21.

In FIG. 21, a sample of a solar cell H was obtained in that, as shown in FIG. 10, a resist coated Si substrate (solar cell material) was patterned with a quasi-hexagonal lattice pattern in which the spatial frequency {circumferential direction (P1): 300 nm; circumferential 60° direction (P2): 330 nm} is uniform, and then subjected to plasma etching by the $CHF_4$ gas to form a sub-wavelength structure having a quasi-hexagonal lattice pattern on the surface thereof.

The pattern height of each sample was measured from cross-section profiles of atomic force microscopy (AFM). It is noted that the height of the pattern in the circumferential direction was smaller than the height in the radial direction. In addition, the height of the portion other than the pattern in the circumferential direction was substantially same with the height in the radial direction, and therefore the height in the radial direction was representatively used as a pattern height.

(Evaluation of Transmittance)

With respect to each sample, the transmittance was evaluated by using a measuring apparatus "V-500", manufactured and sold by JASCO Corporation. Wavelength properties of the transmittances with respect to each sample are shown in FIGS. 22 and 23.

Figure 22:
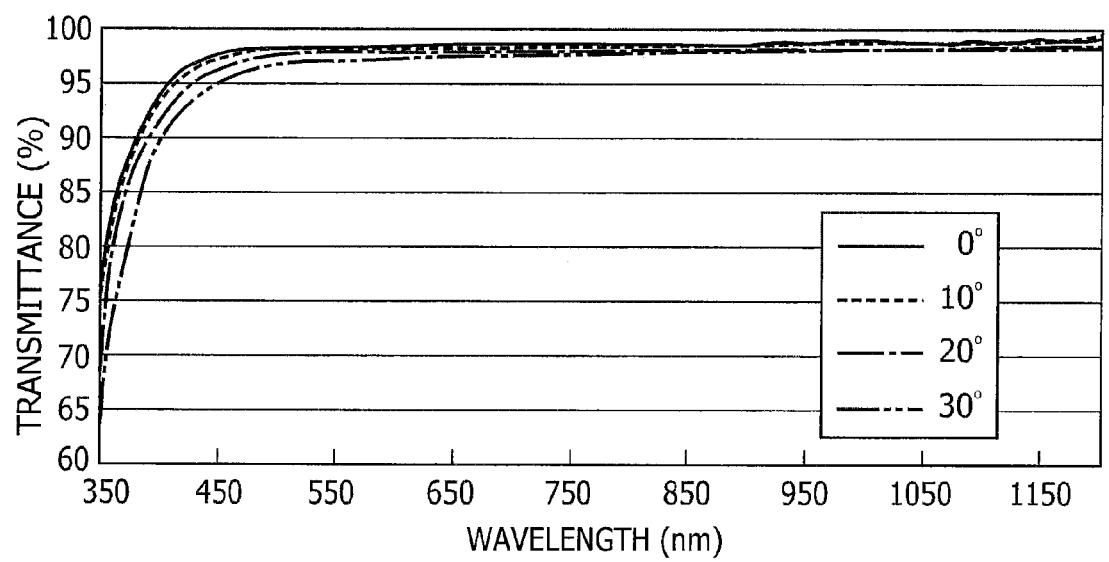
FIG. 22 is a graph showing the wavelength dependency characteristics of the transmittance with respect to the sample FW1 prepared in the sixth example of the present invention.

FIG. 22 shows the transmission characteristics of the sample FW1. It is noted that this sample FW1 is same with the sample FW1 described in the example 2, and FIG. 22 shows a wavelength range wider than that of FIG. 20. As shown in FIG. 22, the sample FW1 has the transmittance of about 98% in a range of wavelength of 400 to 1200 nm, and therefore has a satisfactory property. Further, the transmittance is gradually decreased in a short wavelength range (350 to 400 nm), but satisfactory transmittance of about 70% is obtained even in the wavelength of 350 nm. Further, it was confirmed that the angle dependency is low, and the transmission characteristics stay constant until the incident angle becomes ±300.

Figure 23:
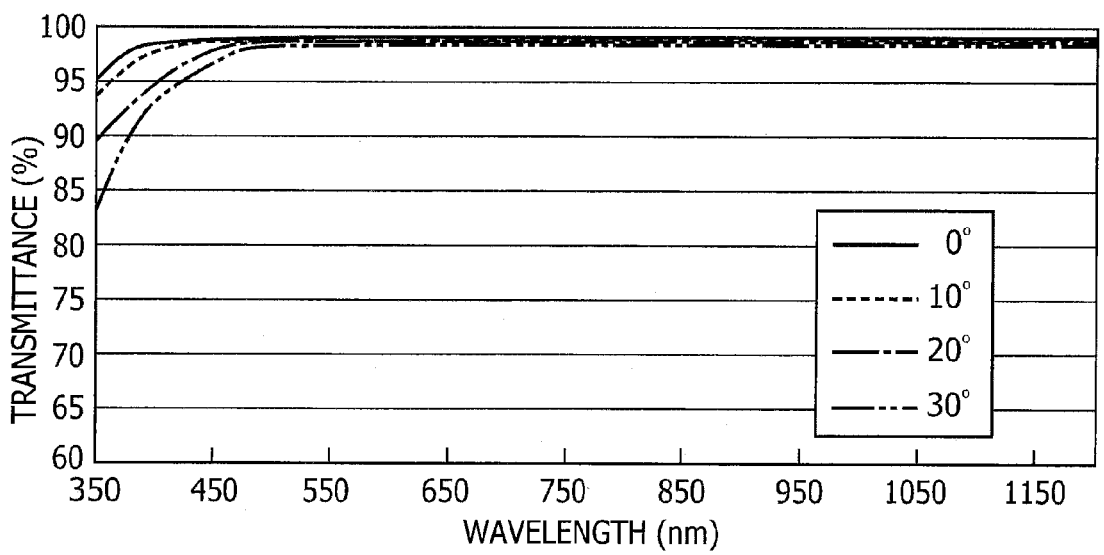
FIG. 23 is a graph showing the wavelength dependency characteristics of the transmittance with respect to the sample GW1 prepared in the sixth example of the present invention.

On the other hand, FIG. 23 shows the transmission characteristics of the sample GW1. Similarly, the sample GW1 has the transmittance of 98% in a range of wavelength of 400 to 1200 nm, and therefore has a satisfactory property.

Further, the transmittance is gradually decreased in a short wavelength range (350 to 400 nm), but satisfactory transmittance property of 90% is obtained even in the wavelength of 350 nm.

Further, it was confirmed that the angle dependency is low, and the transmission characteristics stay constant until the incident angle becomes ±30°.

Figure 24:
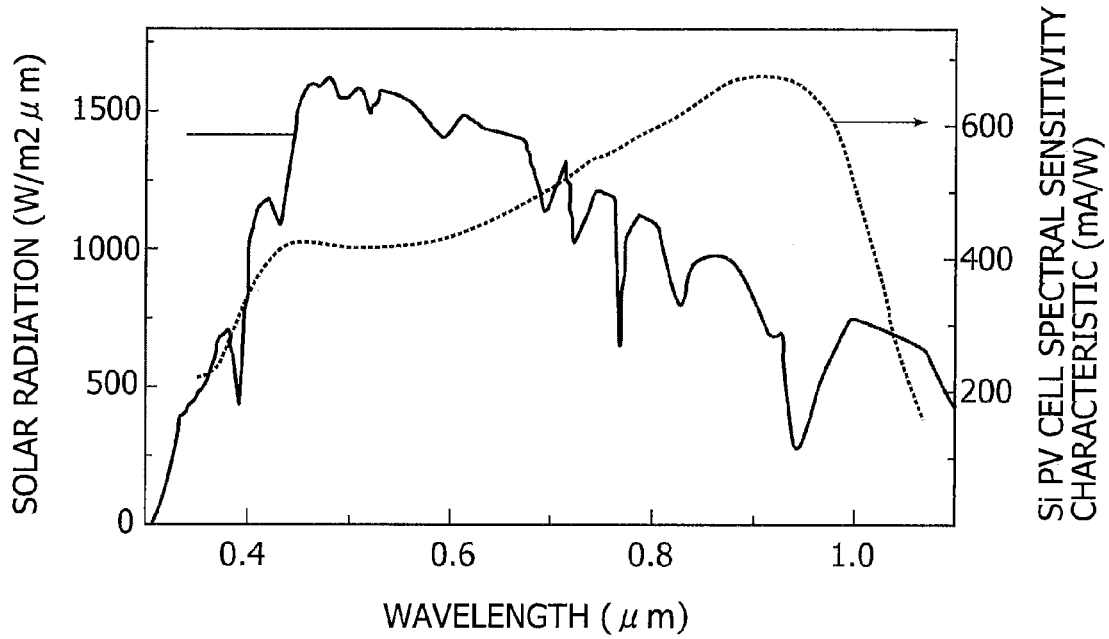
FIG. 24 is a graph showing a relationship between the spectrum of sunlight and the sensitivity distribution of a typical Si solar cell.

FIG. 24 shows the spectrum of sunlight and a sensitivity spectrum of a typical Si solar cell (source of reference: "Thermo Photo Voltaic (TPV) electric generating system" Internet <URL:http://www.mech.tohoku.ac.jp/mech-labs/yugami/resear ch/tpv/tpv info.html>). As shown in FIG. 24, the spectrum of sunlight is distributed in a range of wavelength of 350 to 1200 nm. Accordingly, when the samples FW1 and GW1 according to the present examples having the excellent transmission characteristics in a wide range of wavelength of 350 to 1200 nm are used as a light guide window for a solar cell, it is possible to increase the light utilization efficiency and contribute to improve the power generation efficiency. Further, in addition to a solar cell, the present invention is applicable to a light guide window, and the like, for many light sensors.

From the above results, the satisfactory transmission characteristics can be obtained when the spatial frequency is as follows; P1: 300 to 315 nm and P2: 265 to 275 nm. Further, it is possible to obtain the very excellent transmission characteristics in which the sub-wavelength structure has a high, elliptical cone shape in a distorted hexagonal lattice pattern and the pattern height distribution having the aspect ratio of 1.09 to 1.19. Further, the solar cell H having the sub-wavelength structures of a quasi-hexagonal lattice pattern {circumferential period (arrangement pitch P1): 330 nm; circumferential 60° period (arrangement pitch P2): 300 nm, depth: 251 nm, aspect ratio: 0.85} on a surface has the reflectance (incidence angle of 5°) of around 2% at a pattern portion, which is very small as compared with the reflectance (about 40%) at a flat portions of an Si substrate. Since the solar cell H having the sub-wavelength structure has low angle dependency, about 1.5 to 2 times increase in the efficiency can be expected.

Example 7

An ultraviolet curing the replica substrate sample was obtained by the same method of the example 1, except to change the aspect ratio (H/P) to 0.58, 0.75, 0.92, 1.08, 1.25, 1.42, and 1.58, respectively.

(Evaluation of Reflectance)

Figure 25:
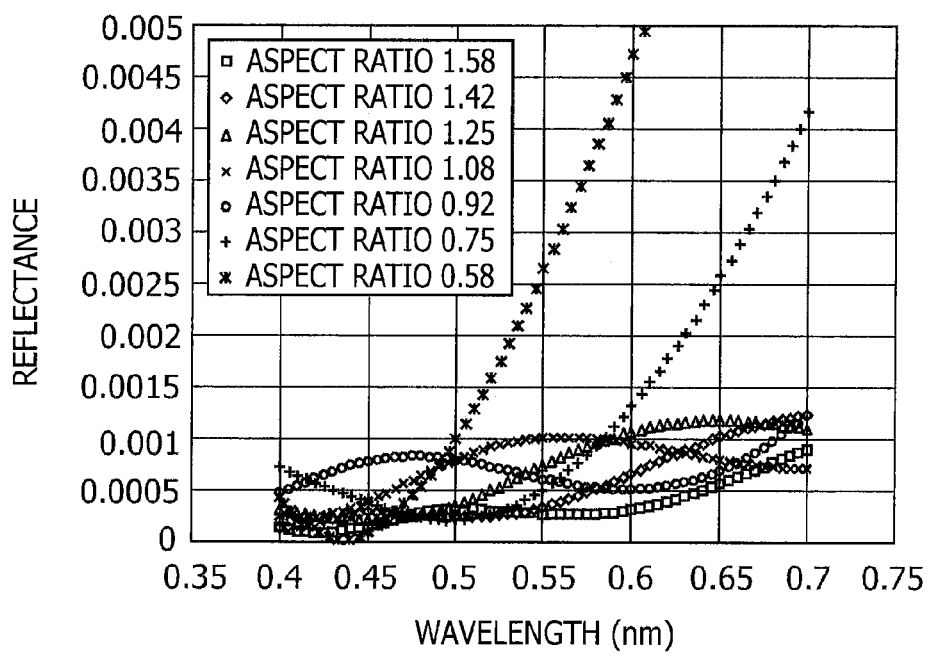
FIG. 25 is a graph showing the wavelength dependency characteristics of the reflectance with respect to the samples prepared in a seventh example of the present invention

With respect to each sample, the reflectance was evaluated by using a machine ("V-500", manufactured and sold by JASCO Corporation). Wavelength properties of the reflectance with respect to each sample are shown in FIG. 25. It is noted that FIG. 25 shows the reflectance being set to "1" for all reflections. From FIG. 25, it can be seen the reflectance on the long wavelength side is increased as the aspect ratio (H/P) becomes small.

Hereinafter, the examples 8 to 10 are explained with reference to FIG. 26 to 28.

Example 8

Figure 26A:
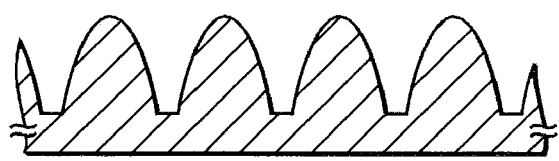
FIG. 26A to 26C are diagrammatic views showing the constructions of optical devices in eighths to tenth examples of the present invention.
Figures 27, 28:
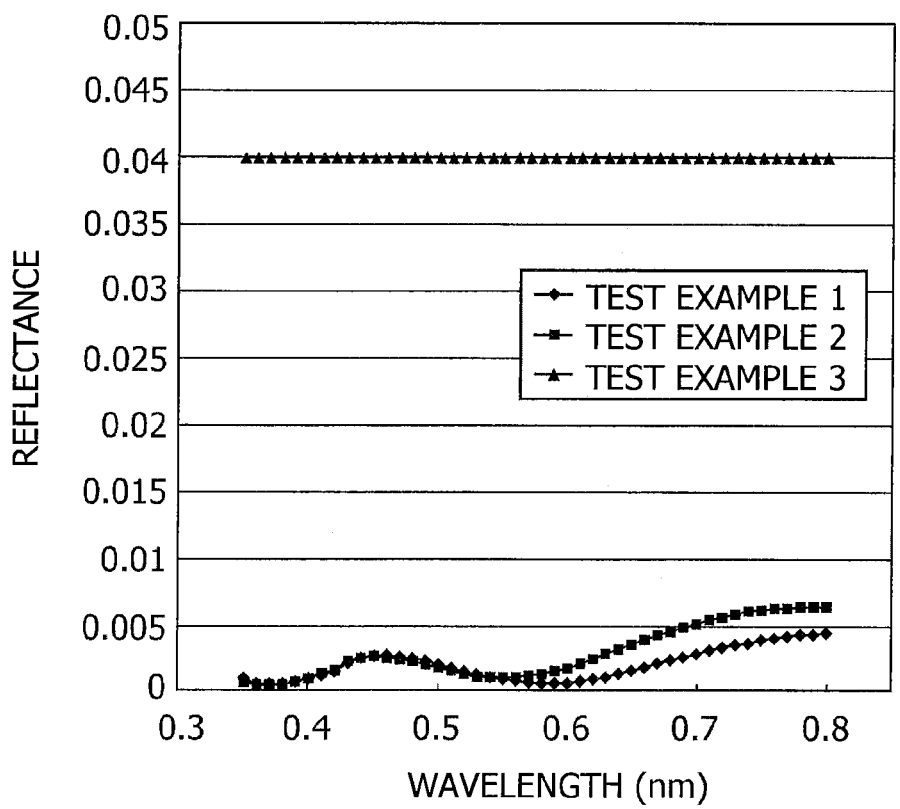
FIG. 27 is a table showing various numerical values of samples in the eighths to tenth examples of the present invention.
FIG. 28 is a graph showing the wavelength dependency characteristics of the reflectance with respect to the eighth to tenth examples of the present invention.
Figure 29:
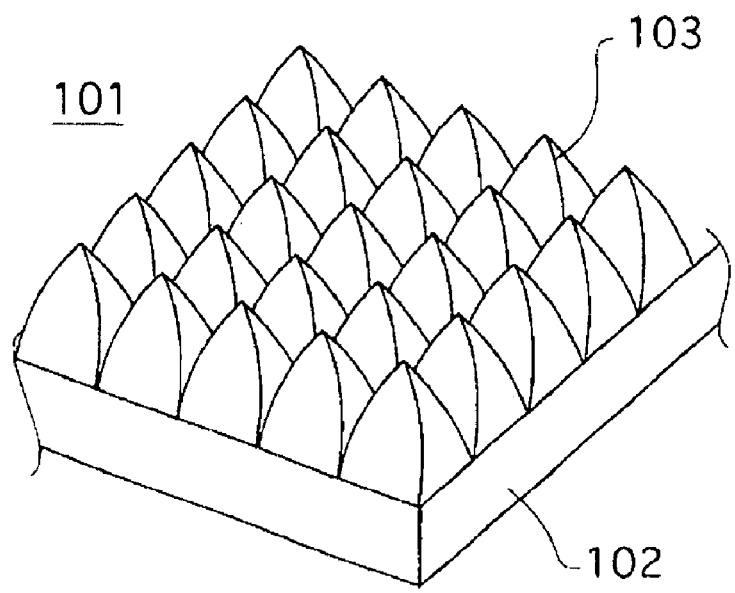
FIG. 29 is a diagrammatic perspective view of a related art optical device.
Figure 30:
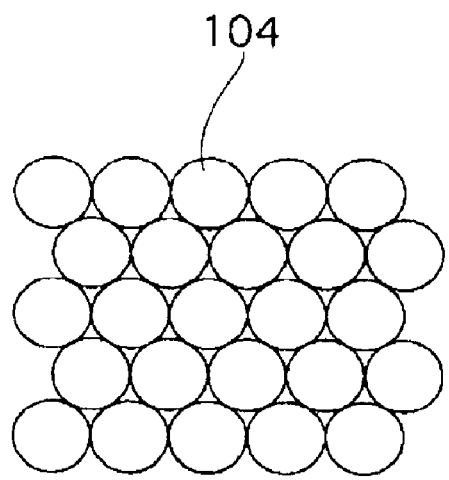
FIG. 30 is a schematic, main portion top view of another related art optical device.
Figure 31:
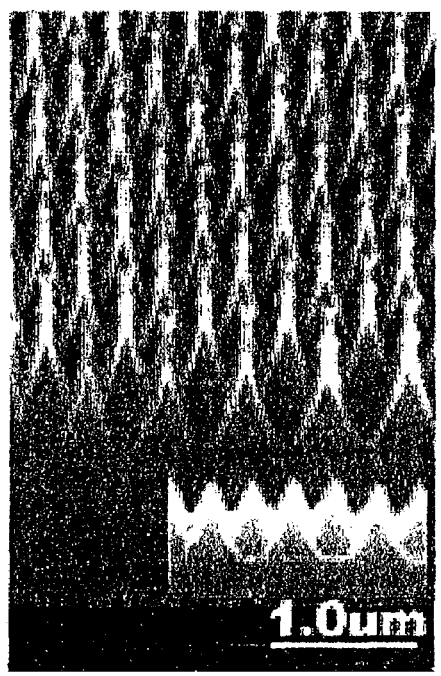
FIG. 31 is a view (SEM photograph) showing the cross-sectional structure of a related art master for use in producing an optical device, which is formed by electron beam exposure.
Figure 32:
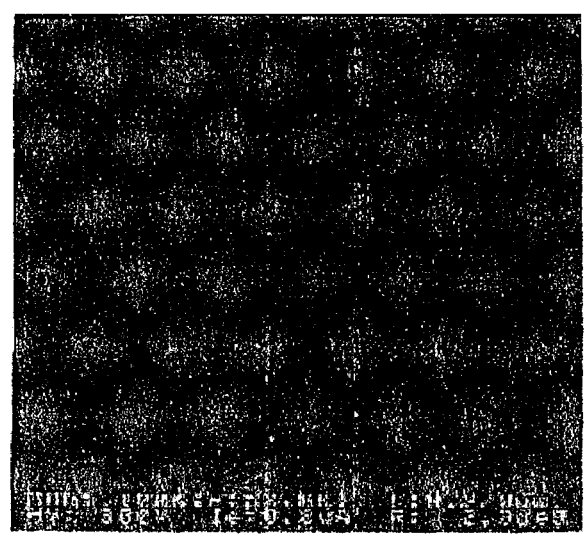
FIG. 32 is a main portion top view of the related art master for use in producing an optical device shown in FIG. 31.
Figure 33:
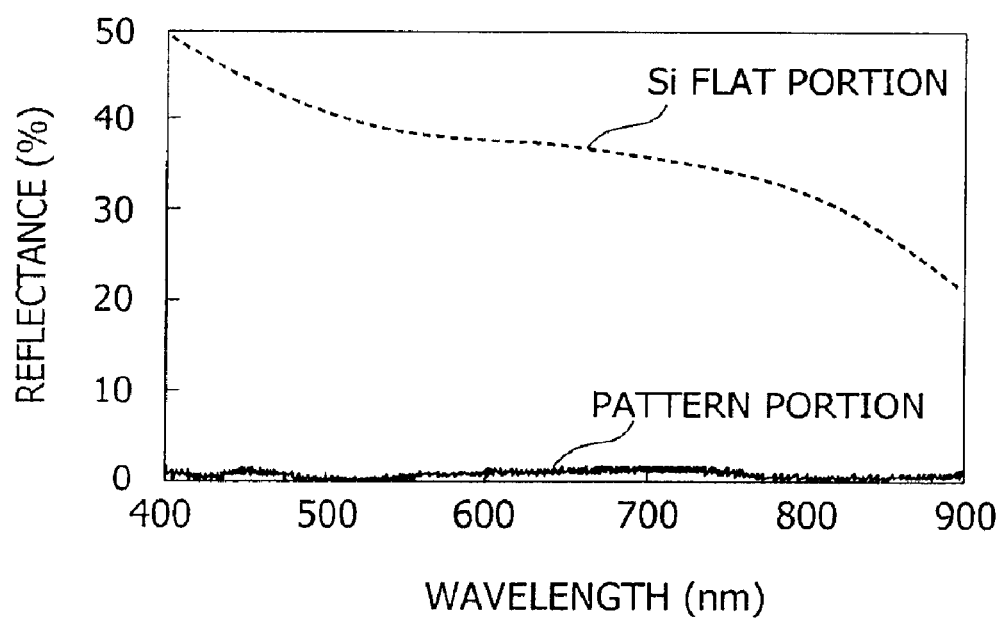
FIG. 33 is a graph showing the wavelength dependency characteristics of the reflectance with respect to the optical device prepared based on the related art master for use in producing an optical device shown in FIG. 32.
Figure 34:
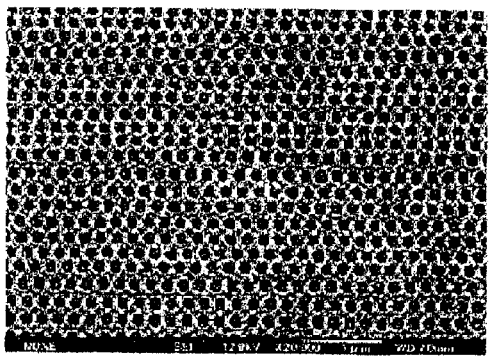
FIG. 34 is a main portion top view of a related art master for use in producing an optical device, which is formed by utilizing a recording technique of optical disc.
Figure 35:
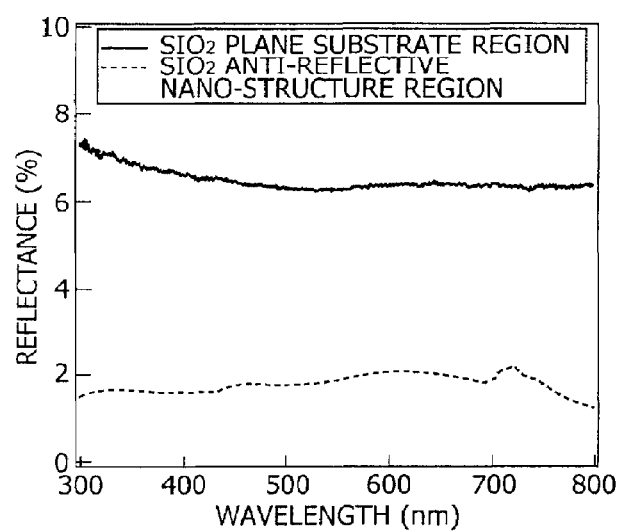
FIG. 35 is a graph showing the wavelength dependency characteristics of the reflectance with respect to the optical device prepared based on the related art master for use in producing an optical device shown in FIG. 34.

As shown in FIG. 26A, the reflectance property was obtained with respect to an optical device having structures without skirt portions, provided on a main surface in quasi-hexagonal lattice shape. It is noted that a pattern depth of 420 nm, period of 330 nm and an aspect ratio of 1.27 were set as shown in FIG. 27. The result of that is shown in FIG. 28.

Example 9

Figure 26B:
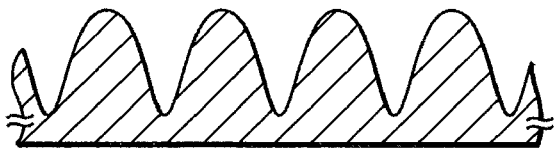

As shown in FIG. 26B, the reflectance property was obtained with respect to an optical device having structures with skirt portions, provided on a main surface. It is noted that a pattern depth of 420 nm, a period of 330 nm, an aspect ratio of 1.27 were set as shown in FIG. 27. In addition, the skirt portion was formed such that 10% of the outside of basic structure was inclined in a range of depth of 70 nm. The result of that is shown in FIG. 28.

Example 10

Figure 26C:
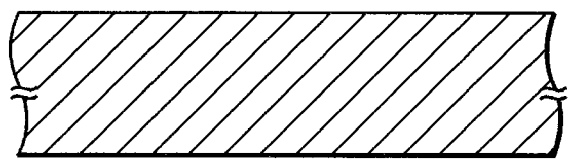

As shown in FIG. 26C, the reflectance property of a transparent plate having no structures was obtained. The result of that is shown in FIG. 28.

(Evaluation of Reflectance Property)

With respect to the examples 8 and 9 having the structures, the reflectance can be largely reduced as compared with that of the example 10 having no structures. Further, the example 9 having the structures with the skirt portions can obtain the reflectance substantially equal to the reflectance of the example 8 having no skirt portions at the structures. To be noted that if the skirt portions are provided to the structures as the optical device in the example 9, an optical device tends to be easily removed from a mold in a step for producing an optical device.

From the above result, in order to lower the reflectance and remove an optical device from a molding easily, it is preferable to provide the skirt portions to the structures.

The embodiments and examples of the present invention are specifically described, but the present invention is not limited to the embodiments and examples, and can be modified based on the technical concept of the present invention.

For example, the numerical values cited in the embodiments and examples are merely examples and different numerical values may be used where necessary.

Further, the present invention is applicable to an ultra-fine processed structure including borosilicate glass and the like. As such a processed structure, for example, a cover glass for a solid-state image capture device, such as a CCD (Charge Couple device) or CMOS (Complementary Metal-Oxide Semiconductor) are conceivable. As shown in FIG. 22, since the high transmittance is obtained in the visible light, it is considered that the present invention is preferably applicable to the cover glass.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. An optical device comprising:
   a number of structures having higher portions or lower portions are arranged at a fine pitch equal to or shorter than a wavelength of visible light on a surface of a base, wherein;
   each of the structures is arranged to form a plurality of arc track rows on the surface of the base, and to form a quasi-hexagonal lattice pattern, and
   the structure has an elliptical cone or truncated elliptical cone shape having a major axis in a circumferential direction of the arc tracks.
2. The optical device according to claim 1, wherein:
   an arrangement pitch P1 of the structures on the same track is longer than an arrangement pitch P2 of the structures between the adjacent two tracks.
3. The optical device according to claim 1, wherein:
   when an arrangement pitch of the structures on the same track is set to be P1 and an arrangement pitch of the structures between the adjacent two tracks is arranged to be P2, P1/P2 meets 1.00<P1/P2≦1.32.
4. The optical device according to claim 1, wherein:
   each of the structures has an elliptical cone or truncated elliptical cone shape having a major axis in a circumferential direction of the arc tracks and having a slope at a middle portion which is steeper than slopes at a top portion and bottom portion.
5. The optical device according to claim 1, wherein:
   a height or depth of the structures of the arc tracks in the circumferential direction is smaller than the height or depth of the structures of the arc tracks in a radial direction.
6. The optical device according to claim 1, wherein:
   an aspect ratio is in a range of 0.81 to 1.46.
7. The optical device according to claim 5, wherein:
   an aspect ratio is in a range of 0.94 to 1.28.
8. The optical device according to claim 1, wherein:
   an aspect ratio is in a range of 0.94 to 1.46.
9. The optical device according to claim 1, wherein:
   an aspect ratio is in a range of 0.81 to 1.28.
10. The optical device according to claim 1, wherein:
    the arrangement pitch P1 of the structures on the same track is in a range of 300 nm to 350 nm and the arrangement pitch P2 of the structures between the adjacent two tracks is in a range of 265 nm to 300 nm.
11. The optical device according to claim 1, wherein:
    the plurality of structures are provided on both of light incident surface and light exit surface.
12. A method for producing a master for use in producing an
    optical device in which a number of structures having higher portions or lower portions are arranged at a fine pitch equal to or shorter than a wavelength of visible light,
    the method wherein comprising:
    a first step for preparing a substrate having a resist layer formed on a surface;
    a second step for forming a latent image at a pitch shorter than a wavelength of visible light by intermittently irradiating a laser beam on the resist layer while rotating the substrate and relatively moving the laser beam in a radial direction of the rotation of the substrate; and
    a third step for forming the resist pattern on a surface of the substrate by developing the resist layer, wherein;
    in the second step, the latent image is formed to constitute an elliptical shape having a major axis in a rotation direction of the substrate and constituting a quasi-hexagonal lattice pattern in adjacent three row tracks.
13. The method for producing a master for use in producing an optical device according to claim 12, wherein:
    in the second step, the laser beam irradiation for the resist layer is performed while changing an irradiation period per each track.
14. The method for producing a master for use in producing an optical device according to claim 12, wherein:
    a formation pitch of the latent image on the same track is arranged to be longer than a formation pitch of the latent image between the adjacent two tracks.
15. The method for producing a master for use in producing an optical device according to claim 12, wherein:
    the substrate is rotated at a constant angular velocity.
16. The method for producing a master for use in producing an optical device according to claim 12, the method further comprising:
    a fourth step in which etching processing is performed by using the resist pattern as a mask to form an uneven structure on a surface of the substrate, after the third step.
17. The method for producing a master for use in producing an optical device according to claim 16, wherein:
    in the fourth step, ashing processing for the resist pattern and etching processing for the surface of the substrate are alternately performed.
18. The method for producing a master for use in producing an optical device according to claim 17, wherein:
    while setting an ashing time at a certain period and gradually increasing an etching time, ashing for the resist pattern and etching for the surface of the substrate are alternately performed, and then, while setting the ashing time at a certain period and gradually decreasing the etching time, the ashing for the resist pattern and the etching for the surface of the substrate are alternately performed.
19. The method for producing a master for use in producing an optical device according to claim 17, wherein:
    while setting the ashing time and the etching time at a certain period, respectively, the ashing for the resist pattern and the etching for the surface of the substrate are alternately performed.
20. A photoelectric conversion apparatus characterized by comprising:
    a photoelectric conversion layer; and
    a light-transmissive optical device provided at a light receiving portion of the photoelectric conversion layer, wherein;
    the optical device has a number of structures having higher portions or lower portions arranged at a fine pitch equal to or shorter than a wavelength of visible light on a light receiving surface, each of the structures is arranged to constitute a plurality of arc track on the light incident surface, and to form a quasi-hexagonal lattice pattern, and the structure has an elliptical cone or truncated elliptical cone shape having a major axis in a circumferential direction of the arc tracks.

21. The photoelectric conversion apparatus according to claim 20, wherein:

the photoelectric conversion layer has a laminated body formed of a semiconductor layer and an electrolyte layer, sandwiched between a first electrode and a second electrode.

* * * * *